(12) United States Patent
Salvi et al.

(10) Patent No.: US 6,701,482 B2
(45) Date of Patent: Mar. 2, 2004

(54) METHOD AND APPARATUS FOR CODING BITS OF DATA IN PARALLEL

(75) Inventors: Rohan S. Salvi, San Diego, CA (US); Michael A. Howard, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/957,820

(22) Filed: Sep. 20, 2001

(65) Prior Publication Data

US 2003/0101401 A1 May 29, 2003

(51) Int. Cl.[7] ............................................. H03M 13/03
(52) U.S. Cl. ....................................... 714/786; 714/755
(58) Field of Search ................................ 714/788, 786, 714/755, 792, 804, 712, 751, 790; 341/81

(56) References Cited

U.S. PATENT DOCUMENTS

| 4,901,307 A | | 2/1990 | Gilhousen et al. |
| 5,103,459 A | | 4/1992 | Gilhousen et al. |
| 5,446,747 A | * | 8/1995 | Berrou ........................ 714/788 |
| 6,023,783 A | * | 2/2000 | Divsalar et al. ............ 714/792 |

* cited by examiner

Primary Examiner—Albert Decady
Assistant Examiner—Mujtaba K Chaudry
(74) Attorney, Agent, or Firm—Philip Wadsworth; Kent Baker; Sandra L. Godsey

(57) ABSTRACT

A concatenated encoder capable of coding multiple data bits in parallel and including a first (outer) encoder, a memory, and a second (inner) encoder coupled in cascade. The first encoder receives and codes M data bits in parallel in accordance with a first coding scheme to generate MR code bits. The memory receives and stores unpunctured ones of the MR code bits from the first encoder. The second encoder receives and codes N code bits in parallel in accordance with a second coding scheme to generate coded data. M and N can be any values (e.g., $M \geq 8$, $N \geq 4$). Each encoder can be a (e.g., a rate ½) convolutional encoder that implements a particular polynomial generator, and can be implemented with one or more look-up tables, a state machine, or some other design.

24 Claims, 11 Drawing Sheets

METHOD AND APPARATUS FOR CODING BITS OF DATA IN PARALLEL

BACKGROUND OF THE INVENTION

I. Field of the Invention

The present invention relates to data communications. More particularly, the present invention relates to coding multiple bits of data in parallel (e.g., using a multiple-port memory) to significantly reduce delays associated with coding.

II. Description of the Related Art

In a typical digital communications system, data is processed, modulated, and conditioned at a transmitter unit to generate a modulated signal that is then transmitted to one or more receiver units. The data processing may include, for example, formatting the data into a particular frame format, coding the formatted data with a particular coding scheme to provide error detection and/or correction at the receiver units, channelizing (i.e., covering) the coded data, and spreading the channelized data over the system bandwidth. The data processing is typically defined by the system or standard being implemented.

At the receiver unit, the transmitted signal is received, conditioned, demodulated, and digitally processed to recover the transmitted data. The processing at the receiver unit is complementary to that performed at the transmitter unit and may include, for example, despreading the received samples, decovering the despread samples, and decoding the decovered symbols to recover the transmitted data.

The ability to correct transmission errors enhances the reliability of a data transmission. Many digital communications systems employ a convolutional code or a Turbo code to provide error correction capability at the receiver units. Convolutional codes operate on serial data, one or a few bits at a time. There are a variety of useful convolutional codes, and a variety of algorithms for decoding the received coded information sequences to recover the original data. Turbo coding specifically is a parallel-concatenated convolutional coding scheme. A concatenated code is a cascaded combination of two or more codes and is used to provide additional error correction capabilities. For a concatenated code, the code bits between the coding stages may be interleaved (i.e., reordered) to provide temporal diversity, which can further improve performance. An entire packet or frame of code bits is typically stored before the reordering is performed. The reordered code bits are then serially retrieved and coded by the next coding stage.

Conventionally, convolutional and Turbo coding are performed serially on an input bit stream. For each clock cycle, one data bit is provided to the encoder, and two or more code bits are generated depending on the code rate of the encoder. Some of the code bits may then be punctured (i.e., deleted) to obtain code bits at other code rates.

Digital multiple access communications systems typically transmit data in packets or frames to allow for efficient sharing of system resources among active users. For services that cannot tolerate long delays (e.g., voice, video), the packets are selected to be short in duration (e.g., 10 msec), and the codes are accordingly selected to have shorter processing delays. However, for improved coding efficiency, it is desirable to process and code larger sized packets, which can result in longer processing delays using the conventional technique that serially codes data. The long processing delays may adversely impact the performance of the communications system. For example, a particular user or data rate may be selected for a particular data transmission based on the conditions of the communications link. If the processing delays are excessively long, the link conditions may have changed by the time of the data transmission, and performance may be compromised or adversely affected.

As can be seen, techniques that can be used to efficiently code data with shorter processing delays are highly desirable.

SUMMARY OF THE INVENTION

According to one aspect, encoders are capable of coding multiple bits in parallel to greatly shorten the coding time. Two or more encoders can be serially concatenated to form a concatenated encoder, such as a Turbo encoder commonly used in CDMA communications systems. By coding M bits in parallel with a first (outer) encoder and N bits in parallel with a second (inner) encoder, the overall coding delays for the concatenated encoder can be significantly reduced. An interleaver typically couples between the first and second encoders and supports parallel coding with its ability to receive multiple code bits for a write operation and provide multiple code bits for a read operation.

One embodiment provides a concatenated encoder for coding multiple data bits in parallel. The concatenated encoder includes a first (outer) encoder, a memory, and a second (inner) encoder coupled in cascade. The first encoder receives and codes M data bits in parallel in accordance with a first coding scheme to generate MR code bits, where R is related to the code rate of the outer encoder (e.g., R=2 for a rate ½ encoder). The memory receives and stores the unpunctured (i.e., non-deleted) MR code bits from the first encoder. The second encoder receives and codes N code bits in parallel in accordance with a second coding scheme to generate coded data comprising NR code bits, when R is related to the code rate of the inner encoder (e.g., R=2 for a rate ½ encoder). M and N can be any values. For example, M can be eight or more, and N can be four or more.

Each of the first and second encoders can be a convolutional encoder that implements a particular polynomial generator matrix (e.g., a rate ½ convolutional code). Each encoder can also be implemented with one or more look-up tables, a state machine, or some other design. To reduce memory requirements, the coding can be performed and completed by both encoders for a particular packet before coding is initiated on another packet. To reduce processing delays, the first encoder can code one packet while the second encoder codes another packet (i.e., pipelined coding).

The memory can be implemented with a multi-port memory having P ports (P>1), a single memory unit, or multiple memory units. The memory can be designed to store W words in parallel for a write operation and provide R words in parallel for a read operation, with each word including a particular number of code bits (e.g., eight). The memory can be operated to provide interleaving of code bits stored within the memory. For example, W words can be stored to sequential rows in the memory with a write operation and R words can be retrieved from permutated rows in the memory with a read operation.

The concatenated encoder can further include a set of N multiplexers used to provide N code bits in parallel to the second encoder. Each multiplexer receives a respective word from the memory, selects one of the code bits in the received word, and provides the selected bit to the second encoder.

Another embodiment provides a convolutional encoder for coding multiple data bits in parallel. The convolutional encoder includes a state machine coupled to an output generator. The state machine receives M data bits in parallel and provides a set of values indicative of the next state of the state machine. The next state is a function of the M data bits and the current state of the state machine. The output generator also receives the M data bits and the current state and generates MR code bits in response thereto. M and MR can be any number greater than one (e.g., $M \geq 8$, $MR \geq 16$).

The state machine typically implements a particular polynomial generator matrix and can be implemented with a set of logic elements (e.g., gates) coupled to a set of registers. Each logic element couples to selected ones of the M data bits and the current state values to implement a particular logic function for one bit of the state machine. The registers store output values from the logic elements and the register outputs comprise the current state of the state machine.

To code packets of data, the output generator may include first and second output generators. The first output generator receives the M data bits and the current state and generates MR code bits in response thereto for a first coding phase (e.g., data). The second output generator also receives the M data bits and the current state and generates MR code bits in response thereto for a second coding phase (e.g., code-tail). The code bits from either the first or second output generator are selected, depending on the coding phase being executed. The state machine is typically set to a known state (e.g., all zeros) in the second coding phase.

Yet another embodiment provides a data encoder for coding multiple bits in parallel. The data encoder includes an input interface, a multi-bit encoder, a memory, and an output interface. The input interface receives M data bits and provides the received bits to the multi-bit encoder. The multi-bit encoder can be selected to receive and code the M data bits in parallel to generate MR code bits, or to receive and code N code bits in parallel to generate NR code bits. The memory stores unpunctured bits of the MR code bits from the multi-bit encoder and, when directed, provide N code bits to the multi-bit encoder. The output interface receives the NR code bits from the multi-bit encoder and provides unpunctured bits of the NR code bits as coded data. The data encoder typically further includes an address generator that generates addresses for write and read operations for the memory.

Still another embodiment provides a transmitter unit for use in a communications system (e.g., a CDMA system). The transmitter unit includes an encoder, a modulator, and a transmitter coupled in cascade. The encoder receives and codes M data bits in parallel in accordance with a first coding scheme to generate MR code bits, stores unpunctured ones of the MR code bits, interleaves code bits for a particular packet, receives and codes N code bits in parallel in accordance with a second coding scheme to generate NR code bits, and provides unpunctured ones of the NR code bits as coded data. The modulator receives and modulates the coded data with a particular modulation scheme to generate modulated data. And the transmitter receives and processes the modulated data to generate a modulated signal suitable for transmission. The encoder can be designed to implement a Turbo code or a concatenated code.

Another embodiment provides a method for performing concatenated coding of multiple data bits in parallel. In accordance with the method, M data bits are received and coded in parallel in accordance with a first coding scheme to generate MR code bits. Zero or more of the MR code bits may be punctured with a particular puncturing scheme, and the unpunctured code bits are stored to a memory. At the appropriate time, N code bits are retrieved from the memory and coded in parallel in accordance with a second coding scheme to generate coded data. For efficiency and reduced delays, W words of unpunctured code bits may be written concurrently to W ports of the memory, and R words of code bits may be read concurrently from R ports of the memory. To provide interleaving, W words can be stored to sequential rows in the memory with a write operation and R words can be retrieved from permutated rows in the memory with a read operation.

Other aspects and embodiments of the invention are described below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION OF THE SPECIFIC EMBODIMENTS

Figure 1:
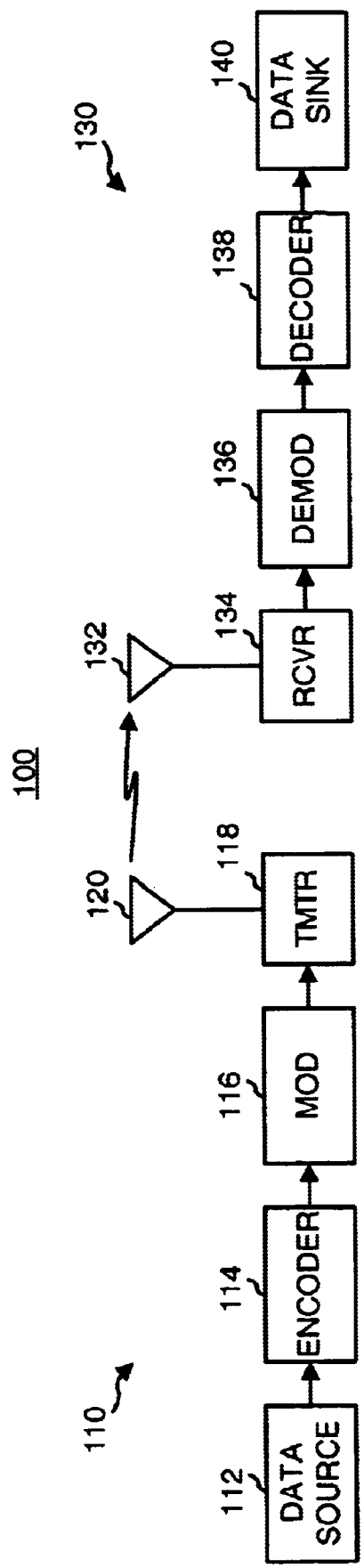
FIG. 1 is a block diagram of a communications system.

FIG. 1 is a simplified block diagram of an embodiment of a communications system 100 in which various aspects of the present invention may be implemented. At a transmitter unit 110, traffic data is sent, typically in packets or frames, from a data source 112 to an encoder 114 that formats and codes the data using a particular coding scheme. Encoder 114 typically further performs interleaving (i.e., reordering) of the code bits. A modulator (MOD) 116 then receives, channelizes (i.e., covers), and spreads the coded data to generate symbols that are then converted to one or more analog signals. The analog signals are filtered, (quadrature) modulated, amplified, and upconverted by a transmitter (TMTR) 118 to generate a modulated signal, which is then transmitted via an antenna 120 to one or more receiver units.

At a receiver unit 130, the transmitted signal is received by an antenna 132 and provided to a receiver (RCVR) 134. Within receiver 134, the received signal is amplified, filtered, downconverted, quadrature demodulated, and digitized to provide samples. The samples are despread, decovered, and demodulated by a demodulator (DEMOD) 136 to generate demodulated symbols. A decoder 138 then decodes the demodulated symbols and (possibly) reorders the decoded data to recover the transmitted data. The processing performed by demodulator 136 and decoder 138 is complementary to the processing performed at transmitter unit 110. The recovered data is then provided to a data sink 140.

The signal processing described above supports transmissions of voice, video, packet data, messaging, and other types of communication in one direction. A bi-directional communications system supports two-way data transmission. However, the signal processing for the other direction is not shown in FIG. 1 for simplicity.

Communications system 100 can be a Code Division-Multiple Access (CDMA) system, a Time Division-Multiple Access (TDMA) communications system (e.g., a GSM system), a Frequency Division-Multiple Access (FDMA) communications system, or other multiple access communications system that supports voice and data communication between users over a terrestrial link.

The use of CDMA techniques in a multiple access communications system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS," and U.S. Pat. No. 5,103,459, entitled "SYSTEM AND METHOD FOR GENERATING WAVEFORMS IN A CDMA CELLULAR TELEPHONE SYSTEM." Another specific CDMA system is disclosed in U.S. patent application Ser. No. 08/963,386, entitled "METHOD AND APPARATUS FOR HIGH RATE PACKET DATA TRANSMISSION," filed Nov. 3, 1997 (hereinafter referred to as the HDR system), now U.S. Pat. No. 6,574,211, issued on Jun. 3, 2003 to Padovani et al. These patents and patent application are assigned to the assignee of the present invention and incorporated herein by reference.

CDMA systems are typically designed to conform to one or more standards such as the "TIA/EIA/IS-95-A Mobile Station-Base Station Compatibility Standard for Dual-Mode Wideband Spread Spectrum Cellular System" (hereinafter referred to as the IS-95-A standard), the "TIA/EIA/IS-98 Recommended Minimum Standard for Dual-Mode Wideband Spread Spectrum Cellular Mobile Station" (hereinafter referred to as the IS-98 standard), the standard offered by a consortium named "3rd Generation Partnership Project" (3GPP) and embodied in a set of documents including Document Nos. 3G TS 25.211, 3G TS 25.212, 3G TS 25.213, and 3G TS 25.214 (hereinafter referred to as the W-CDMA standard), and the "TR-45.5 Physical Layer Standard for cdma2000 Spread Spectrum Systems" (hereinafter referred to as the CDMA-2000 standard). New CDMA standards are continually proposed and adopted for use. These CDMA standards are incorporated herein by reference.

Figure 2:
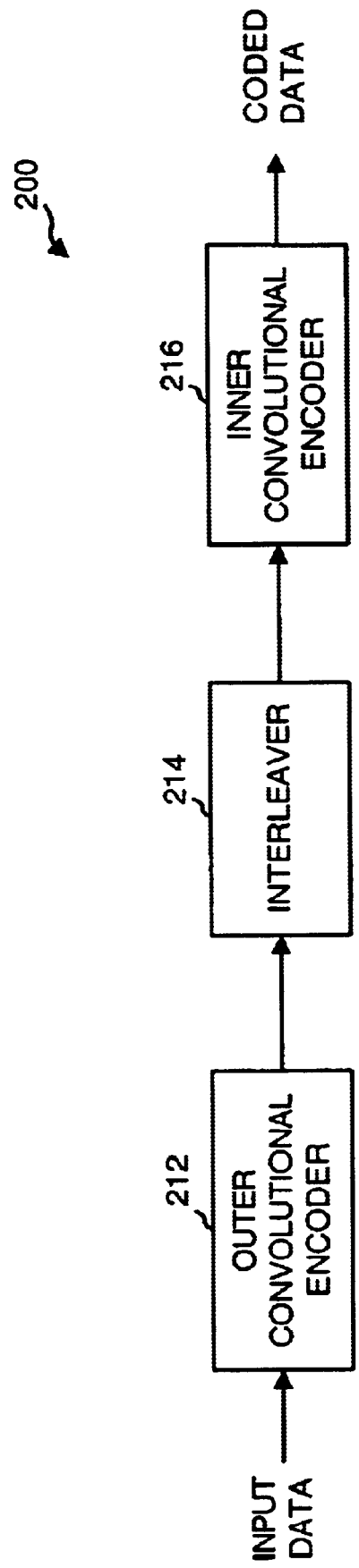
FIG. 2 is a block diagram of an encoder that can be designed to implement some embodiments of the present invention.

FIG. 2 is a block diagram of an encoder 200 that can be designed to implement some embodiments of the present invention. Encoder 200 may be used for encoder 114 in FIG. 1. In this embodiment, encoder 200 implements a concatenated code and includes an outer convolutional encoder 212, an interleaver 214, and an inner convolutional encoder 216 coupled in cascade. Outer convolutional encoder 212 receives and convolutionally codes the input data to generate code bits, which are provided to interleaver 214 for storage. Once an entire packet of code bits has been stored in interleaver 214, the code bits are retrieved and provided to inner convolutional encoder 216. To achieve the interleaving, the code bits are read out in an order that is different from the order in which the bits are written to interleaver 214. Outer convolutional encoder 212 receives and convolutionally codes the code bits to generate coded data, which is then provided to the subsequent processing stage.

A conventional convolutional encoder receives and codes data serially, one bit at a time (i.e., per clock cycle). For communications systems that transmit data in large packets, the serial coding of data can result in long processing delays. Moreover, for a concatenated coder made up of multiple convolutional encoders coupled in cascade, the processing delays can be excessively long, especially if the outer and inner convolutional encoders both code bits serially.

In one aspect, a convolutional encoder is capable of receiving and coding multiple (M) bits in parallel. This capability allows the convolutional encoder to code a packet of data in approximately $(1/M)^{th}$ the amount of time required by a conventional convolutional encoder. The benefits are more pronounced for a concatenated coder (e.g., a Turbo coder) when each of the individual convolutional encoders processes bits in parallel.

According to another aspect, an interleaver is capable of storing and providing multiple bits of data in parallel. The interleaver may be implemented using, for example, a multi-port memory. When used in combination with the convolutional encoders described herein, the interleaver can further reduce the processing delays since data can be written to, and read from the interleaver in a fraction of the time.

For clarity, an exemplary embodiment is now described for an encoder used for a downlink data transmission in the communications system described in the aforementioned U.S. patent application Ser. No. 08/963,386 (i.e., the HDR system). The HDR system employs a concatenated code comprised of an outer convolutional code, interleaving, and an inner convolutional code. The HDR system also defines two packet formats having the properties listed in Table 1.

TABLE 1

| Parameters | Packet Format 1 | Packet Format 2 | Units |
|---|---|---|---|
| Total bits/packet | 1024 | 2048 | bits |
| Outer convolutional encoder | | | |
| Input data bits/packet | 1018 | 2042 | bits |
| Code-tail bits/packet | 4 | 4 | bits |
| Outer code rate | ½ | ⅔ | |
| Outer code puncture pattern | (1111) | (1011) | |
| Output code bits/packet | 2044 | 3069 | bits |
| Interleaver depth | 2048 | 3072 | bits |
| Inner convolutional encoder | | | |
| Input code bits/packet | 2044 | 3069 | bits |
| Code-tail bits/packet | 4 | 3 | bits |
| Inner code rate | ½ | ¾ | |
| Inner code puncture pattern | (111111) | (111001) | |
| Output code bits/packet | 4096 | 4096 | bits |
| Overall code rate | ¼ | ½ | |

In the HDR system, the outer convolutional encoder implements a rate ½ convolutional code defined by the following polynomial generator matrix:

$$G_O(x) = \left[1, \frac{x^4 + x^2 + x + 1}{x^4 + x^3 + 1}\right]. \quad \text{Eq (1)}$$

The inner convolutional encoder in the HDR system implements a rate ½ convolutional code defined by the following polynomial generator matrix:

$$G_I(x) = \left[1, \frac{x^2 + x + 1}{x + 1}\right]. \quad \text{Eq (2)}$$

Figure 3:
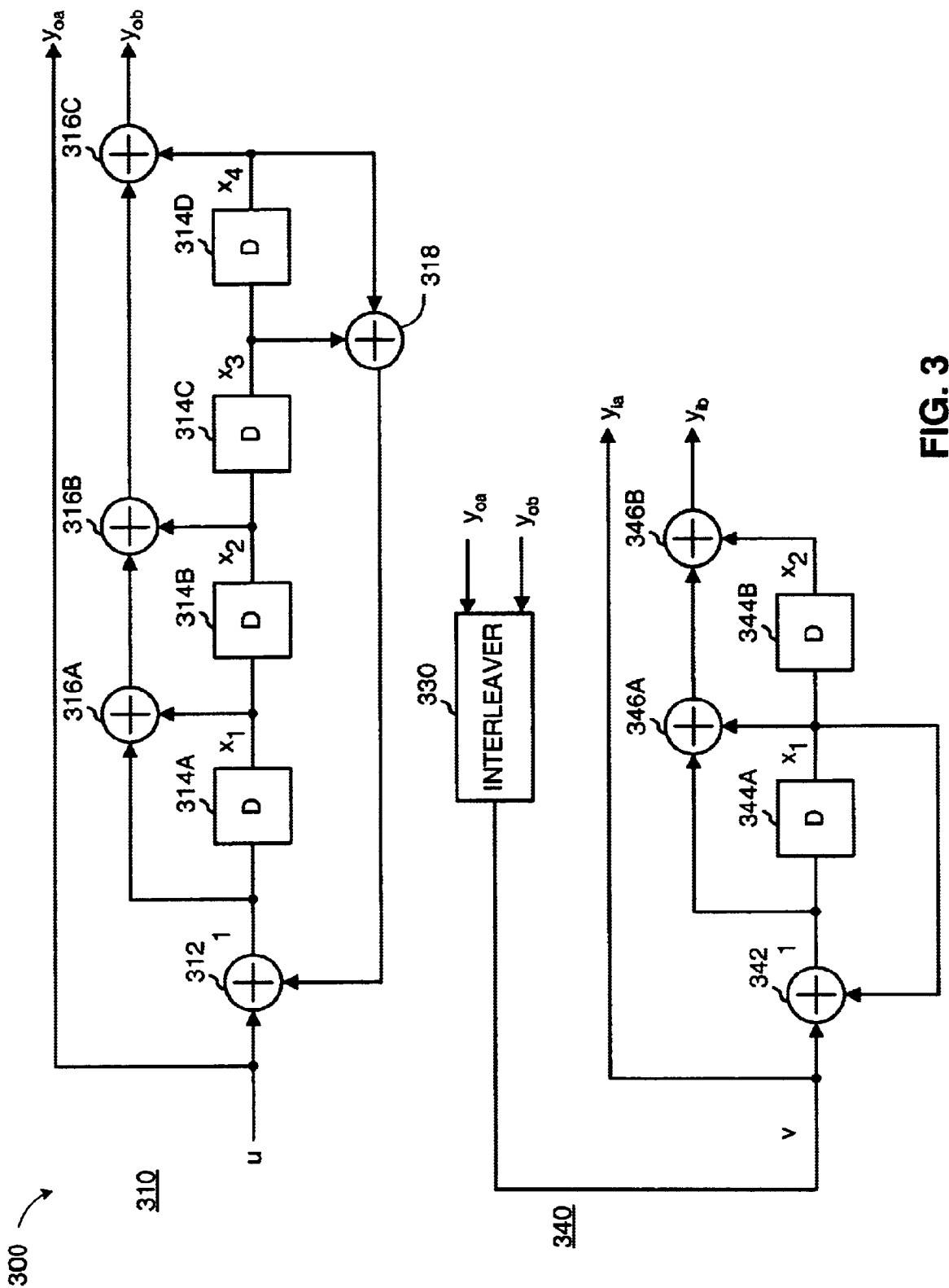
FIG. 3 is a diagram of a concatenated encoder which implements a particular set of polynomial generator matrices according to one embodiment.

FIG. 3 is a diagram of an encoder 300 that implements the outer and inner convolutional codes defined by equations (1) and (2). The data bits u are provided to an outer convolutional encoder 310 that implements equation (1) and generates two outputs $y_{oa}$ and $y_{ob}$. Within encoder 310, the data bits u are provided to a summer 312 that further couples in cascade with registers 314a through 314d (which are used to implement a set of delays). The outputs from summer 312 and registers 314A, 314B, and 314D are summed by summers 316A, 316B, and 316C to implement the numerator of the second element in the polynomial generator matrix expressed in equation (1). The outputs from registers 314C and 314D are summed by a summer 318 and provided to summer 312 to implement the denominator of the second element in equation (1). The input data bits u are provided as the first output $y_{oa}$ and the output from summer 316c comprises the second output $y_{ob}$.

The code bits in the outputs $y_{oa}$ and $y_{ob}$ of outer convolutional encoder 310 may be punctured (not shown in FIG. 3 for simplicity). The unpunctured code bits are then provided to interleaver 330 and reordered. The reordered code bits v are then provided to an inner convolutional encoder 340 that implements equation (2) and generates two outputs $y_{ia}$ and $y_{ib}$. Within encoder 340, the code bits v are provided a summer 342 that couples in cascade with registers 344A and 344B. The outputs from summer 342 and registers 344A and 344B are summed by summers 346A and 346B to implement the numerator of the second element in the polynomial generator matrix expressed in equation (2). The output from register 344A is provided to summer 342 to implement the denominator of the second element in equation (2). The input code bits v are provided as the first output $y_{ia}$ and the output from summer 346B comprises the second output $y_{ib}$.

Conventionally, the data bits u are provided serially to encoder 310 and the code bits v are also provided serially to encoder 340. For each input data bit, outer convolutional encoder 310 generates two code bits. Interleaver 330 receives and stores the code bits, and provides the code bits serially to inner convolutional encoder 340. The coding of the bits in a serial manner results in long processing delays.

The convolutional encoder of one embodiment is capable of coding multiple bits in parallel to significantly shorten the coding delays. For each clock cycle, multiple (e.g., M) data bits can be received and coded to generate multiple code bits. For a rate ½ encoder, 2M code bits are generated for the M data bits. M can be selected to be any number such as, for example, 4, 8, 16, 32, and so on. Various alternate embodiments of such a convolutional encoder are described below.

Many digital communications systems, such as the High Data Rate (HDR) system, transmit data in packets. The number of bits in a packet (i.e., the packet size) is selected based on a number of criteria such as, for example, the data rate, the amount of data to transmit, the processing delays requirements, and so on. To allow the decoder at the receiver unit to start at a known state at the beginning of each packet, which shortens the decoding time and improves performance, the encoder is initialized to a known state (e.g., all zeros) at the start of each packet. The initialization is achieved by inserting a set of code tail bits at the end of the preceding packet. The code-tail bits are selected such that the encoder is set to the known state.

In one embodiment, the convolutional encoder of the exemplary embodiment is implemented with a look-up table. Referring to FIG. 3, outer convolutional encoder 310 may be viewed as a state machine with a 4-bit state defined by the outputs of registers 314A through 314D. To generate the contents of the look-up table, the M input data bits at time index n can be represented by a vector $U_n$, the 2M code bits can be represented by a vector $Y_n$, and the current encoder state can be represented by a vector $X_n$. The next state $X_{n+1}$ for the encoder and the encoder output vector $Y_n$ can be expressed as:

| Data | Code-tail | |
|---|---|---|
| $X_{n+1} = f(X_n, U_n)$ | $X_{n+1} = 0$ | Eq (3) |
| $Y_n = g_1(X_n, U_n)$ | $Y_n = g_2(X_n, U_n)$ | Eq (4) |

Each of equations (3) and (4) provides one equation to use when the input is data and another equation to use when the encoder input includes code-tail bits.

Equations (3) and (4) can be computed for all possible combinations of input data bits and encoder states. For example, for equation (4), the output code bits can be computed for the input vector $U_n=0 \ldots 00$ and an encoder state of $X_n=0 \ldots 00$, an input vector $U_n=0 \ldots 01$ and the encoder state of $X_n=0 \ldots 00$, and so on, and an input vector $U_n=1 \ldots 11$ and the encoder state of $X_n=0 \ldots 00$. The output code bits can then be computed for all possible combination of the input vector $U_n$ and an encoder state of $X_n=0 \ldots 01$. The process then continues until all combinations of input vector and encoder state are computed. Equation (3) can also be computed in a similar manner.

The results from the computations for equations (3) and (4) can be stored to a memory that implements a look-up table. The required memory size is dependent on the number of data bits to be coded in parallel and the particular polynomial generator matrix being implemented. For example, if eight data bits are to be coded in parallel with the convolutional code expressed in equation (1), a memory having a size of 12 address bits and 20 data bits (i.e., 4096×20) can be used. The 12-bit address is composed of 8 input data bits and 4 bits for the current encoder state. The 20-bit output includes 16 code bits and 4 bits for the next encoder state.

Once the memory has been properly defined, the input data vector $U_n$ and the current encoder state $X_n$ can be provided to the address input of the memory, which then provides the output vector $Y_n$ and the next encoder state $X_{n+1}$. The next encoder state $X_{n+1}$ is appropriately stored for use with the next input data vector $U_{n+1}$.

In another embodiment, the convolutional encoder is implemented with a state machine. The encoder state and output can be expressed as shown in equations (3) and (4). Each of equations (3) and (4) can be recursively solved, and the resulting equations are then implemented in hardware, software, or a combination thereof. The recursive equations for the encoder may be solved as follows. Let $$X_n^T = [\, x_4 \quad x_3 \quad x_2 \quad x_1 \,]$$

denotes the transposed state vector and $u_0$ denotes the input data bit at time index 0. The next state and output of the encoder can then be expressed as:

$$X_1 = AX_0 + Bu_0, \quad \text{Eq (5)}$$

$$y_0 = CX_0 + Du_0. \quad \text{Eq (6)}$$

where A, B, C, and D are scalar, vectors, and matrix that are dependent on the particular polynomial generator matrix being implemented. The encoder state equation (5) can be recursively solved as follows:

$$X_2 = A^2 X_0 + ABu_0 + Bu_1$$

$$X_3 = A^3 X_0 + A^2 Bu_0 + ABu_1 + Bu_2$$

$$\vdots$$

$$X_8 = A^8 X_0 + A^7 Bu_0 + A^6 Bu_1 + A^5 Bu_2 + A^4 Bu_3 + A^3 Bu_4 + A^2 Bu_5 + ABu_6 + Bu_7$$

The encoder output equation (6) can also be recursively solved in similar manner.

Equations (5) and (6) are used to code one data bit u at a time. A similar set of equations can be derived for coding M data bits in parallel. For example, for coding 8 data bits in parallel (i.e., M=8), the transpose of the input data vector at time index n can be defined as $$U_n^T = [\, u_{n7} \quad u_{n6} \quad u_{n5} \quad u_{n4} \quad u_{n3} \quad u_{n2} \quad u_{n1} \quad u_{n0} \,]$$

and the transpose of the output code vector can be defined as $$Y_n^T = [\, y_{n7} \quad y_{n6} \quad y_{n5} \quad y_{n4} \quad y_{n3} \quad y_{n2} \quad y_{n1} \quad y_{n0} \,].$$

Using the defined vector notations for $U_n$ and $Y_n$, equations (5) and (6) can be expressed as:

$$X_{n+1} = FX_n + GU_n, \quad \text{Eq (7)}$$

$$Y_n = HX_n + IU_n. \quad \text{Eq (8)}$$

where F, G, H, and I are vectors and matrices that are dependent on the particular polynomial generator matrix being implemented, the current encoder state $X_n$, and the input data vector $U_n$. Equation (7) is used to generate the next encoder state $X_{n+1}$ after M data bits have been coded, and equation (8) is used to generate the encoder outputs $Y_n$ for the input vector $U_n$.

To determine F, G, H, and I in equations (7) and (8), equations (5) and (6) can be solved recursively using various techniques and the results from the recursive computations can be used to implement equations (7) and (8). For example, a table can be used to tabulate the state and outputs of the encoder for each input data bit. The entries in the table can then be used to implement equations (7) and (8), as described below.

Table 2 shows the encoder states and outputs after eight input data bits $u_0$ through $u_7$ have been serially provided to convolutional encoder 310 in FIG. 3, which implements equation (1). As shown in FIG. 3, registers 314A through 314D initially store the values of $x_1$, $x_2$, $x_3$, and $x_4$, respectively. On the first clock cycle, the first data bit $u_0$ is provided to encoder 310, and the output of summer 312 is computed as $x_4 + x_3 u_0$, which is stored in the second row, second column in Table 2. The encoder outputs are computed as $y_{a0} = u_0$ and $y_{b0} = (x_4 + x_3 + u_0) + x_4 + x_2 + x_1 = x_3 + x_2 + x_1 + u_0$. (Each summer 316 perform modulo-2 addition.) On the next clock cycle, the values from summer 312 and registers 314A through 314C are shifted into registers 314A through 314D, respectively. The next data bit $u_1$ is provided to the encoder, and the output of summer 312 is computed as $x_3 + x_2 + u_1$, which is stored in the third row, second column in Table 2. The encoder outputs are computed as $y_{a1} = u_1$ and $y_{b2} = (x_3 + x_2 + u_1) + x_3 + x_1 + (x_4 + x_3 + u_0) = x_4 + x_3 + x_2 x_1 + u_0 + u_1$. The process continues until the eighth data bit $u_7$ is received and processed.

The encoder output vector:

$$Y_b = [\, y_{b7} y_{b6} y_{b5} y_{b4} y_{b3} y_{b2} y_{b1} y_{b0} \,]$$

corresponds to the input vector $U = [u_7 \ u_6 \ u_5 \ u_4 \ u_3 \ u_2 \ u_1 \ u_0]$ and is generated based on the entries in the last column in Table 2. The encoder state $X_{n+1}$ after the eighth data bit $u_7$ has been coded is generated based on the entries in the last row in Table 2. As shown in Table 2, the encoder output vector $Y_b$ and the next encoder state $X_{n+1}$ are each a function of the current encoder state $X_n = [x_4 \ x_3 \ x_2 \ x_1]$ and the input vector U. For the data phase, the encoder output vector $Y_a$ is simply a function of the input vector U (i.e., $Y_a = U$).

TABLE 2

| u | 1 | $x_1$ | $x_2$ | $x_3$ | $x_4$ | $y_a$ | $y_b$ |
|---|---|---|---|---|---|---|---|
| $u_0$ | $x_4 + x_3 + u_0$ | $x_1$ | $x_2$ | $x_3$ | $x_4$ | $u_0$ | $x_3 + x_2 + x_1 + u_0$ |
| $u_1$ | $x_3 + x_2 + u_1$ | $x_4 + x_3 + u_0$ | $x_1$ | $x_2$ | $x_3$ | $u_1$ | $x_4 + x_3 + x_2 + x_1 + u_0 + u_1$ |
| $u_2$ | $x_2 + x_1 + u_2$ | $x_3 + x_2 + u_1$ | $x_4 + x_3 + u_0$ | $x_1$ | $x_2$ | $u_2$ | $x_4 + x_2 + x_1 + u_0 + u_1 + u_2$ |
| $u_3$ | $x_4 + x_3 + x_1 + u_0 + u_3$ | $x_4 + x_3 + x_1 + u_0 + u_3$ | $x_3 + x_2 + u_1$ | $x_4 + x_3 + u_0$ | $x_1$ | $u_3$ | $x_4 + x_1 + u_0 + u_1 + u_2 + u_3$ |
| $u_4$ | $x_4 + x_2 + u_0 + u_1 + u_4$ | $x_4 + x_2 + u_0 + u_1 + u_4$ | $x_4 + x_3 + x_1 + u_0 + u_3$ | $x_3 + x_2 + u_1$ | $x_4 + x_3 + u_0$ | $u_4$ | $x_4 + u_0 + u_1 + u_2 + u_3 + u_4$ |
| $u_5$ | $x_3 + x_1 + u_1 + u_2 + u_5$ | $x_4 + x_2 + u_0 + u_1 + u_4$ | $x_4 + x_2 + u_0 + u_1 + u_4$ | $x_4 + x_3 + x_1 + u_0 + u_3$ | $x_3 + x_2 + u_1$ | $u_5$ | $x_3 + u_1 + u_2 + u_3 + u_4 + u_5$ |
| $u_6$ | $x_4 + x_3 + x_2 + u_0 + u_2 + u_3 + u_6$ | $x_3 + x_1 + u_1 + u_2 + u_5$ | $x_4 + x_2 + u_0 + u_1 + u_4$ | $x_4 + x_2 + u_0 + u_1 + u_4$ | $x_4 + x_3 + x_1 + u_0 + u_3$ | $u_6$ | $x_2 + u_2 + u_3 + u_4 + u_5 + u_6$ |

TABLE 2-continued

| u | 1 | $x_1$ | $x_2$ | $x_3$ | $x_4$ | $y_a$ | $y_b$ |
|---|---|---|---|---|---|---|---|
| $u_7$ | $x_3 + x_2 + x_1 + u_1 + u_3 + u_4 + u_7$ | $x_4 + x_3 + x_2 + u_0 + u_2 + u_3 + u_6$ | $x_3 + x_1 + u_1 + u_2 + u_5$ | $x_4 + x_2 + u_0 + u_1 + u_4$ | $x_4 + x_2 + u_0 + u_1 + u_4$ | $u_7$ | $x_1 + u_3 + u_4 + u_5 + u_6 + u_7$ |
| | | $x_3 + x_2 + x_1 + u_1 + u_3 + u_4 + u_7$ | $x_4 + x_3 + x_2 + u_0 + u_2 + u_3 + u_6$ | $x_3 + x_1 + u_1 + u_2 + u_5$ | $x_4 + x_2 + u_0 + u_1 + u_4$ | | |

Referring back to Table 1, the outer convolutional encoder in the HDR system receives 1018 data bits and four code-tail bits for each packet in packet format 1. If eight bits are coded in parallel, 128 clock cycles are used to code one packet of data. The first 127 clock cycles are used to code 1016 data bits (i.e., 127×8=1016), and the 128$^{th}$ clock cycle is used to code the remaining two data bits and four code-tail bits. The first 127 clock cycles are referred to as the "data phase," and the last clock cycle is referred to as the "code-tail phase."

The outer convolutional encoder receives 2042 data bits and four code-tail bits for each packet in packet format 2. If eight bits are coded in parallel, 256 clock cycles are used to code one packet of data. The first 255 clock cycles are used to code 2040 data bits (i.e., 255×8=2040), and the 256$^{th}$ clock cycle is used to code the remaining two data bits and four code-tail bits. The first 255 clock cycles are referred to as the data phase, and the last clock cycle is referred to as the code-tail phase.

Table 3 shows the encoder states and outputs after two data bits $u_0$ and $u_1$ and four code-tail bits have been serially provided to convolutional encoder 310 in FIG. 3. Again, registers 314A through 314D initially store the values of $x_1$, $x_2$, $x_3$, and $x_4$, respectively. On the first two clock cycles, the two data bits, $u_0$ and $u_1$, are serially provided to the encoder. The encoder states $x_1$ through $x_4$ and the encoder outputs $y_c$ and $y_d$ are computed in similar manner as described above. Thus, the second and third rows of Table 3 are identical to the second and third rows of Table 2. On the third clock cycle, the first code-tail bit having a value of $x_2+x_1$ is provided to the encoder. The value of the code-tail bit is selected such that the output of summer 312 is equal to zero, which is used to flush out the convolutional encoder. The encoder outputs are computed as $y_{c2}=x_2+x_1$ and $y_{d2}=x_4+u_0+u_1$. On the next clock cycle, the values from summer 312 and registers 314A through 314C are shifted into registers 314A through 314D, respectively. The second code-tail bit is selected to be $x_4+x_3+x_1+u_0$, again to set the output of summer 312 to zero and flush out the encoder. The processing continues, with the last two bits provided to the encoder having values of zero.

As shown in Table 3, the encoder outputs $Y_c$ and $Y_d$ are both functions of the input vector U and the current encoder state $X_n$. For the code-tail phase, the next encoder state $X_{n+1}$ is set to a known state of all zeros (i.e., $X_8$=[0 0 0 0]).

TABLE 3

| u | 1 | $x_1$ | $x_2$ | $x_3$ | $x_4$ | $y_c$ | $y_d$ |
|---|---|---|---|---|---|---|---|
| $u_0$ | $x_4 + x_3 + u_0$ | $x_1$ | $x_2$ | $x_3$ | $x_4$ | $u_0$ | $x_3 + x_2 + x_1 + u_0$ |
| $u_1$ | $x_3 + x_2 + u_1$ | $x_4 + x_3 + u_0$ | $x_1$ | $x_2$ | $x_3$ | $u_1$ | $x_4 + x_3 + x_2 + x_1 + u_0 + u_1$ |
| $x_2 + x_1$ | 0 | $x_3 + x_2 + u_1$ | $x_4 + x_3 + u_0$ | $x_1$ | $x_2$ | $x_2 + x_1$ | $x_4 + u_0 + u_1$ |
| $x_4 + x_3 + x_1 + u_0$ | 0 | 0 | $x_3 + x_2 + u_1$ | $x_4 + x_3 + u_0$ | $x_1$ | $x_4 + x_3 + x_1 + u_0$ | $x_3 + x_2 + x_1 + u_1$ |
| $x_4 + x_2 + u_0 + u_1$ | 0 | 0 | 0 | $x_3 + x_2 + u_1$ | $x_4 + x_3 + u_0$ | $x_4 + x_2 + u_0 + u_1$ | $x_4 + x_3 + u_0$ |
| $x_3 + x_2 + u_1$ | 0 | 0 | 0 | 0 | $x_3 + x_2 + u_1$ | $x_3 + x_2 + u_1$ | $x_3 + x_2 + u_1$ |
| 0 | 0 | 0 | 0 | 0 | 0 | 0 | 0 |
| 0 | 0 | 0 | 0 | 0 | 0 | 0 | 0 |
| | | | 0 | 0 | 0 | 0 | |

Figure 4:
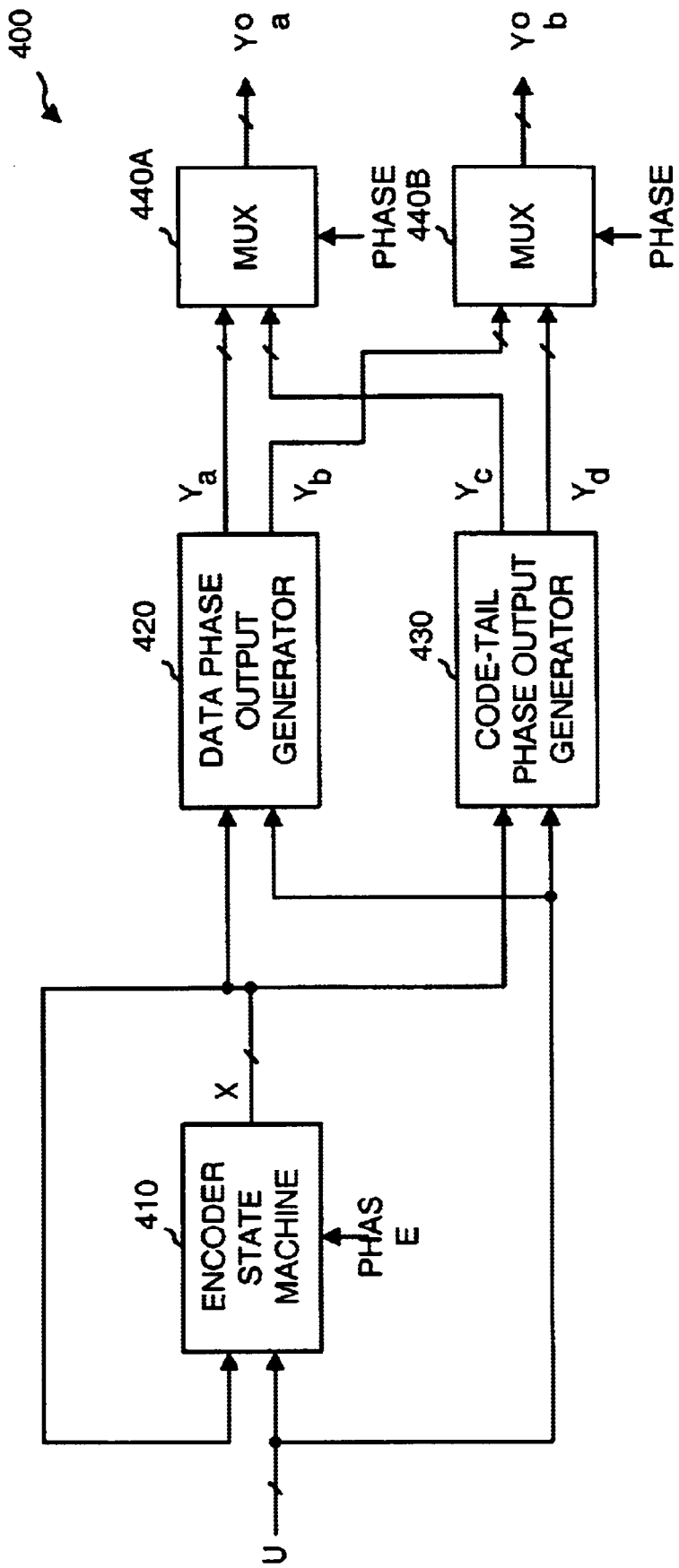
FIG. 4 is a block diagram of a convolutional encoder for coding multiple data bits in parallel according to one embodiment.

FIG. 4 is a block diagram of an embodiment of a convolutional encoder 400 that can code multiple input data bits in parallel. Convolutional encoder 400 can be used to implement the data and code-tail phases (e.g., as defined in Tables 2 and 3, respectively). The encoder architecture shown in FIG. 4 can be used to implement, for example, outer convolutional encoder 310 or inner convolutional encoder 340 in FIG. 3.

Within convolutional encoder 400, the input data bits are provided in parallel as a data vector U to an encoder state machine 410, a data phase output generator 420, and a code-tail phase output generator 430. Encoder state machine 410 also receives the current encoder state X and determines the new encoder state based on the received inputs vector U and the current encoder state X. Encoder state machine 410 can implement, for example, the last row in Table 2.

Data phase output generator 420 and code-tail phase output generator 430 also receive the current encoder state X and determine the encoder outputs for the data phase and the code-tail phase, respectively, based on the received inputs X and U. Data phase output generator 420 can implement, for example, the last two columns in Table 2, and code-tail output generator 430 can implement, for example, the last two columns in Table 3. The first and second outputs, $Y_a$ and $Y_b$, from data phase output generator 420 are provided to multiplexers (MUXes) 440A and 440B, respectively. Similarly, the first and second outputs, $Y_c$ and $Y_d$, from code-tail phase output generator 430 are provided to multiplexers 440A and 440B, respectively. Multiplexers 440A and 440B provide the outputs $Y_a$ and $Y_b$, respectively, from data phase output generator 420 when operating in the data phase and the outputs $Y_c$ and $Y_d$, respectively, from code-tail phase output generator 430 when operating in the code-tail phase.

To implement a convolutional encoder that continuously codes input data bits as they are received, without having to reset the encoder state at the start of each packet, only encoder state machine 410 and data phase output generator 420 are needed. For communications systems (e.g., the HDR system) in which data is sent in packets and code-tail bits are used to reset the convolutional encoder to a known state at the start of each packet, code-tail phase output generator 430 and multiplexers 440A and 440B are used to provide the required encoder outputs.

The design of encoder state machine 410 and data phase output generator 420 is dependent on the particular polynomial generator matrix to be implemented and the number of data bits to be coded in parallel. The design of code-tail phase output generator 430 is dependent on the polynomial generator matrix, the number of data bits to be coded in parallel, and the particular frame format (i.e., the number of data and code-tail bits to be coded in the code-tail phase). A specific design of convolutional encoder 400 is now described below.

Figure 5A:
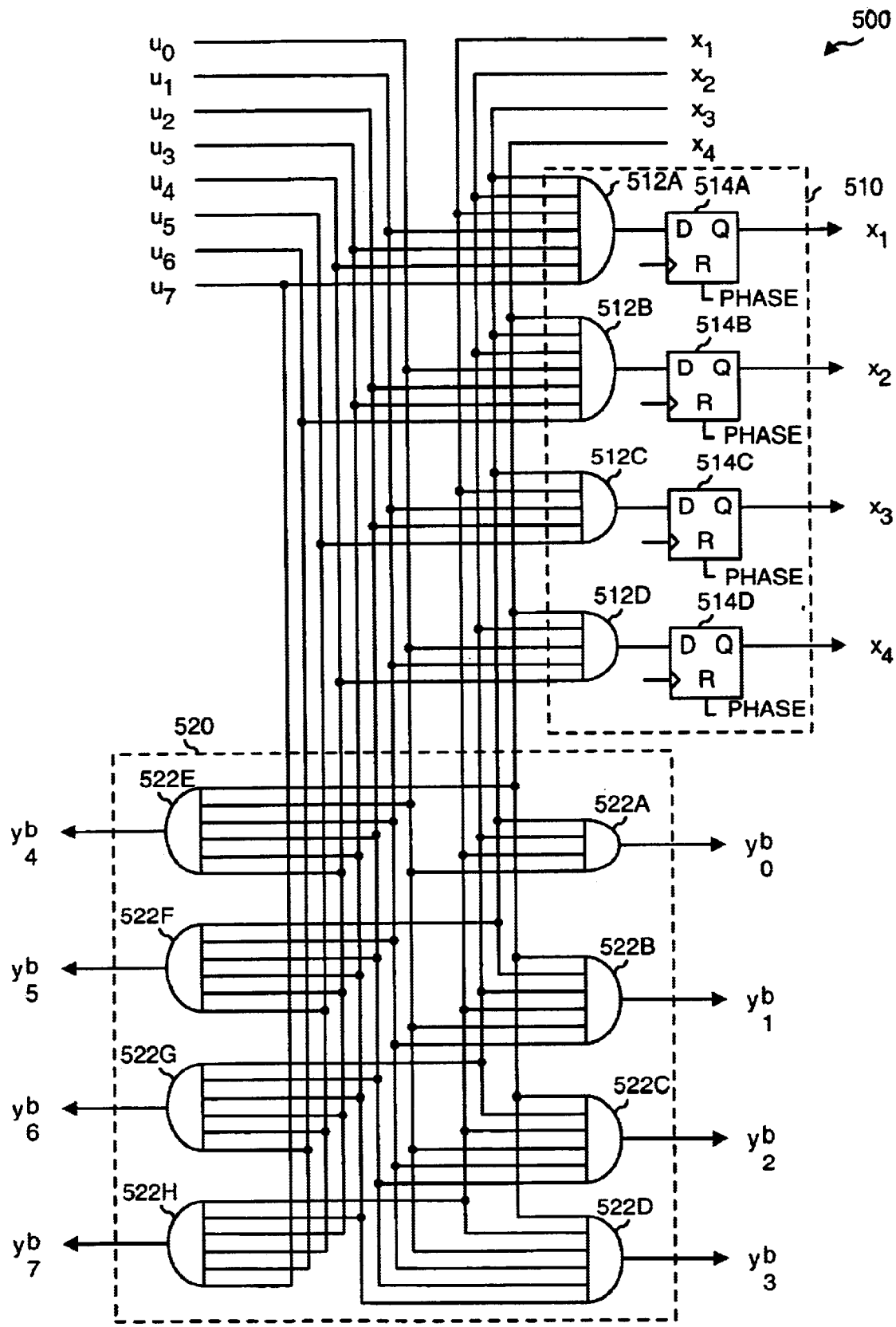
FIGS. 5A and 5B are schematic diagrams of a convolutional encoder which implements a specific polynomial generator matrix and for coding eight data bits in parallel according to various embodiments.

FIG. 5A is a schematic diagram of a specific embodiment of a convolutional encoder 500 that can code eight input data bits in parallel and implements the polynomial generator matrix expressed in equation (1). Convolutional encoder 500 includes an encoder state machine 510 that implements the state machine defined in Table 2 and a data phase output generator 520 that generates the encoder outputs defined in Table 2. Encoder state machine 510 and data phase output generator 520 correspond to encoder state machine 410 and data phase output generator 420, respectively, in FIG. 4. In this embodiment, encoder state machine 510 is implemented with AND gates 512A through 512D and registers 514A through 514D, and data phase output generator 520 is implemented with AND gates 522A through 522H.

As shown in FIG. 5A, the eight input data bits, $u_0$ through $u_7$, are provided in parallel to the inputs to encoder state machine 510 and data phase output generator 520, each of which also receives the current encoder state defined by $x_1$ through $x_4$. Each AND gate 512 within encoder state machine 510 selectively couples to the inputs $u_0$–$u_7$ and $x_1$–$x_4$, as defined by the last row in Table 2. For example, AND gate 512A couples to the inputs $x_3$, $x_2$, $x_1$, $u_1$, $u_3$, $u_4$, and $u_7$, as defined by the entry in the last row, third column ($x_1$) in Table 2. The outputs of AND gates 512A through 512D couple to the inputs of registers 514A through 514D, respectively. The outputs of registers 514A through 514D comprise the state machine outputs $x_1$ through $x_4$, respectively.

Similarly, each AND gate 522 within data phase output generator 520 selectively couples to the inputs $u_0$–$u_7$ and $x_1$–$x_4$, as defined by the last column in Table 2. For example, AND gate 522A couples to the inputs $x_3$, $x_2$, $x_1$, and $u_0$, as defined by the entry in the second row, last column ($y_{b0}$) in Table 2. The inputs $u_0$ through $u_7$ comprise the encoder outputs $y_{a0}$ through $y_{a7}$, respectively (not shown in FIG. 5A for simplicity), and the outputs of AND gates 522A through 522H comprise the encoder outputs $y_{b0}$ through $y_{b7}$, respectively.

Figure 5B:
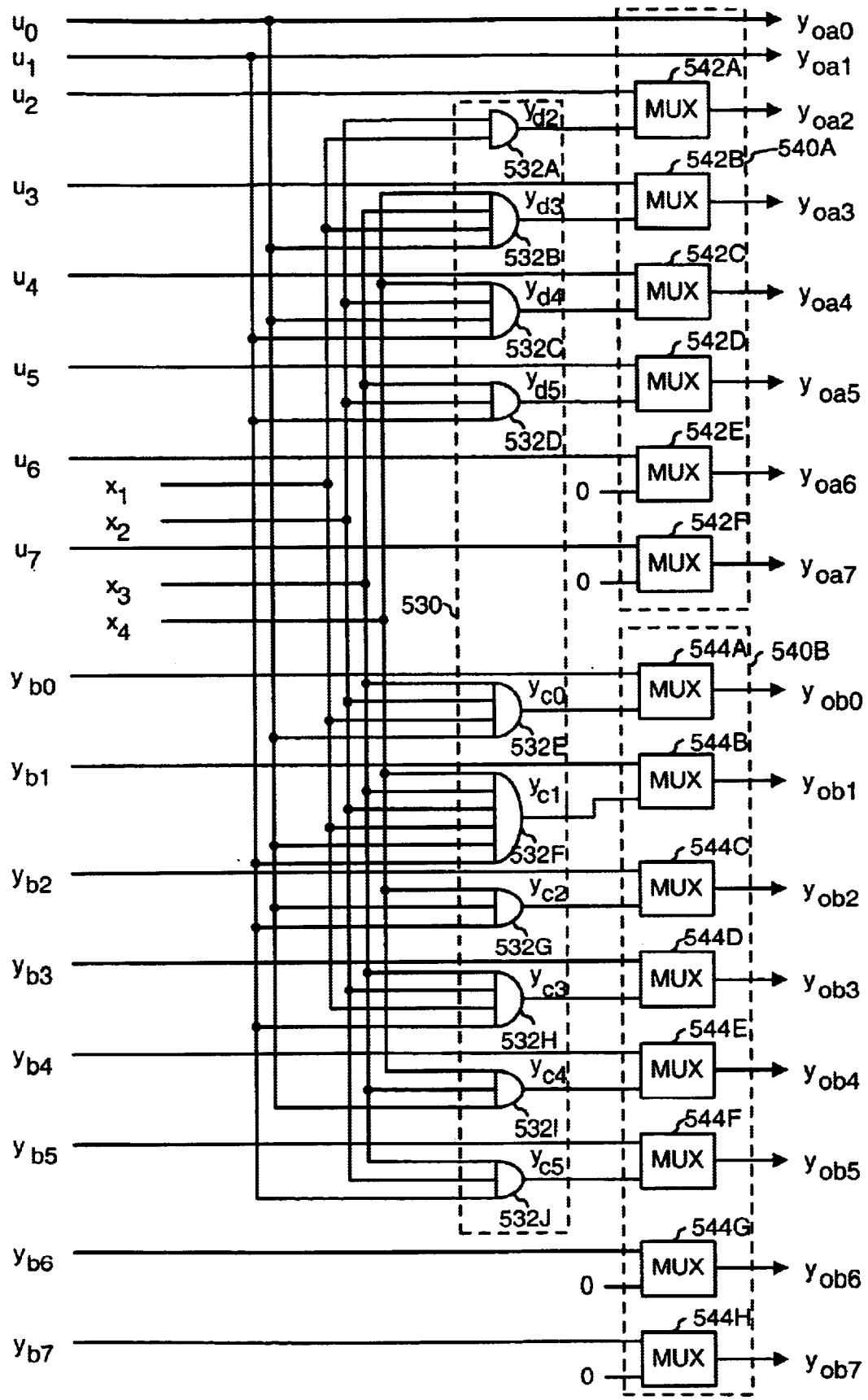

FIG. 5B is a schematic diagram of a specific embodiment of a code-tail phase output generator 530 and multiplexers 540A and 540B that implement the code-tail phase of the polynomial generator matrix expressed in equation (1) and for packet formats 1 and 2 shown in Table 1. Code-tail phase output generator 530 and multiplexers 540A and 540B correspond to code-tail phase output generator 430 and multiplexers 440A and 440B, respectively, in FIG. 4. In this embodiment, code-tail phase output generator 530 is implemented with AND gates 532A through 532J and generates the encoder outputs $Y_c$ and $Y_d$ for the code-tail phase defined in Table 3. Multiplexer 540a is implemented with 2×1 multiplexers 542A through 542F and provides the first encoder output $Y_{oa}$. Similarly, multiplexer 540B is implemented with 2×1 multiplexers 544A through 544H and provides the second encoder output $Y_{ob}$.

Encoder state machine 510, data phase output generator 520, code-tail phase output generator 530, and multiplexers 540A and 540B in FIGS. 5A and 5B form a specific implementation of convolutional encoder 400. This specific implementation is used to implement the polynomial generator matrix expressed in equation (1) and for the packet formats described in Table 1. For packet format 1, 1018 data bits are provided to convolutional encoder 500 over 128 clock cycles. For each of the first 127 clock cycles, eight data bits are provided to encoder 500, and multiplexers 540A and 540B are selected to provide the outputs $Y_a$ and $Y_b$ from data phase output generator 520. On the $128^{th}$ clock cycle, the remaining two data bits, four code-tail bits, and two zeros are provided to encoder 500. Registers 514A through 514D are reset to zero (synchronously), and multiplexers 540A and 540B are selected to provide the outputs $Y_c$ and $Y_d$ from code-tail phase output generator 530. For packet format 2, 2042 data bits are provided to convolutional encoder 500 over 256 clock cycles. For each of the first 255 clock cycles, corresponding to the data phase, eight data bits are coded in parallel and multiplexers 540A and 540B provide the outputs $Y_a$ and $Y_b$, respectively. On the $256^{th}$ clock cycle, corresponding to the code-tail phase, two data bits, four code-tail bits, and two zeros are coded in parallel and multiplexers 540A and 540B provide the outputs $Y_c$ and $Y_d$, respectively.

The specific implementation shown in FIGS. 5A and 5B is described to provide a clearer understanding. It will be noted that different implementations can also be contemplated and are within the scope of the present invention. Moreover, a different design is typically used for a different polynomial generator matrix, a different number of input data bits, or different packet formats.

In similar manner, another convolutional encoder can be designed to implement the polynomial generator matrix expressed in equation (2). In an embodiment, the convolutional encoder is designed to receive and code four code bits in parallel. Equations (5) and (6) for the next encoder state and outputs, respectively, can be recursively solved in the manner described above.

Table 4 shows the encoder states and outputs after four input code bits $v_0$ through $v_3$ have been serially provided to convolutional encoder 340 in FIG. 3. Registers 344A and 344B initially store the values of $x_1$ and $x_2$, respectively. On the first clock cycle, the first code bit $v_0$ is provided to encoder 340, and the output of summer 342 is computed as $x_1+v_0$, which is stored in the second row, second column in Table 4. The encoder outputs are computed as $y_{e0}=v_0$ and $y_{f0}=(x_1+v_0)+x_2+x_1=x_2+v_0$. On the next clock cycle, the values from summer 312 and register 344A are shifted into registers 344A and 344B, respectively. The next code bit $v_1$ is provided to encoder 340, and the output of summer 342 is computed as $x_1+v_0+v_1$, which is stored in the third row, second column. The outputs are computed as $y_{e1}=v_1$ and $y_{f1}=(x_1+v_0+v_1)+(x_1+v_0)+x_1=x_1+v_1$. The processing continues until the fourth code bit $v_3$ is received and processed.

The encoder output vector $Y_f$ is generated based on the entries in the last column in Table 4. The encoder state $X_{n+1}$ after the fourth code bit $v_3$ has been coded is generated based on the entries in the last row in Table 4. As shown in Table 4, the encoder output vector $Y_f$ and the next encoder state $X_{n+1}$ are each a function of the current encoder state $X_n=[x_2\ x_1]$ and the input vector V. For the data phase, the encoder output vector $Y_e$ is simply a function of the input vector V.

TABLE 4

| v | 1 | $x_1$ | $x_2$ | $y_e$ | $y_f$ |
|---|---|---|---|---|---|
| $v_0$ | $x_1 + v_0$ | $x_1$ | $x_2$ | $v_0$ | $x_2 + v_0$ |
| $v_1$ | $x_1 + v_0 + v_1$ | $x_1 + v_0$ | $x_1$ | $v_1$ | $x_1 + v_1$ |
| $v_2$ | $x_1 + v_0 + v_1 + v_2$ | $x_3 + x_2 + u_1$ | $x_1 + v_0$ | $v_2$ | $x_1 + v_0 + v_2$ |
| $v_3$ | $x_1 + v_0 + v_1 + v_2 + v_3$ | $x_1 + v_0 + v_1 + v_2$ | $x_3 + x_2 + u_1$ | $v_3$ | $x_1 + v_0 + v_1 + v_3$ |
|  | $x_1 + v_0 + v_1 + v_2 + v_3$ | $x_1 + v_0 + v_1 + v_2$ |  |  |  |

Referring back to Table 1, the inner convolutional encoder in the HDR system receives 2044 code bits and four code-tail bits for each packet in packet format 1. If four bits are coded in parallel, 512 clock cycles are used to code one packet. The first 511 clock cycles are used to code 2044 code bits (i.e., 511×4=2044), and the 512$^{th}$ clock cycle is used to code the four code-tail bits. The convolutional encoder receives 3079 code bits and three code-tail bits for each packet in packet format 2. If four bits are coded in parallel, 768 clock cycles are used to code one packet of data. The first 767 clock cycles are used to code 3068 code bits (i.e., 767×4=3068), and the 768$^{th}$ clock cycle is used to code the last code bit and three code-tail bits.

Table 5 shows the states and outputs of the inner convolutional encoder for the code-tail phase for packet format 1. On the first clock cycle, the first code-tail bit of having a value of $x_1$ is provided to the encoder. The code-tail bit value is selected such that the output of summer 342 is equal to zero. The encoder outputs are computed as $y_{g0}=x_1$ and $y_{h0}=x_2+x_1$. The processing continues in similar manner for the remaining three code-tail bits.

TABLE 5

| v | 1 | $x_1$ | $x_2$ | $y_g$ | $y_h$ |
|---|---|---|---|---|---|
| $x_1$ | 0 | $x_1$ | $x_2$ | $x_1$ | $x_2 + x_1$ |
| 0 | 0 | 0 | $x_1$ | 0 | $x_1$ |
| 0 | 0 | 0 | 0 | 0 | 0 |
| 0 | 0 | 0 | 0 | 0 | 0 |
|  |  | 0 | 0 |  |  |

Table 6 shows the states and outputs of the inner convolutional encoder for the code-tail phase for packet format 2. On the first clock cycle, the last code bit $v_0$ is provided to the encoder, and the encoder states $x_1$ and $x_2$ and outputs $y_{i0}$ and $y_{j0}$ are computed in similar manner as described above. The second row of Table 6 is thus identical to the second row of Table 4. On the second clock cycle, the first code-tail bit having a value of $x_1+v_0$ is provided to the encoder. The code-tail bit value is selected such that the output of summer 342 is equal to zero. The encoder outputs are computed as $y_{i1}=x_1+v_0$ and $y_{j1}=v_0$. The processing continues in similar manner for the remaining code-tail bits.

TABLE 6

| v | 1 | $x_1$ | $x_2$ | $y_i$ | $y_j$ |
|---|---|---|---|---|---|
| $v_0$ | $x_1 + v_0$ | $x_1$ | $x_2$ | $v_0$ | $x_2 + v_0$ |
| $x_1 + v_0$ | 0 | $x_1 + v_0$ | $x_1$ | $x_1 + v_0$ | $v_0$ |
| 0 | 0 | 0 | $x_1 + v_0$ | 0 | $x_1 + v_0$ |
| 0 | 0 | 0 | 0 | 0 | 0 |
|  |  | 0 | 0 |  |  |

Figure 6:
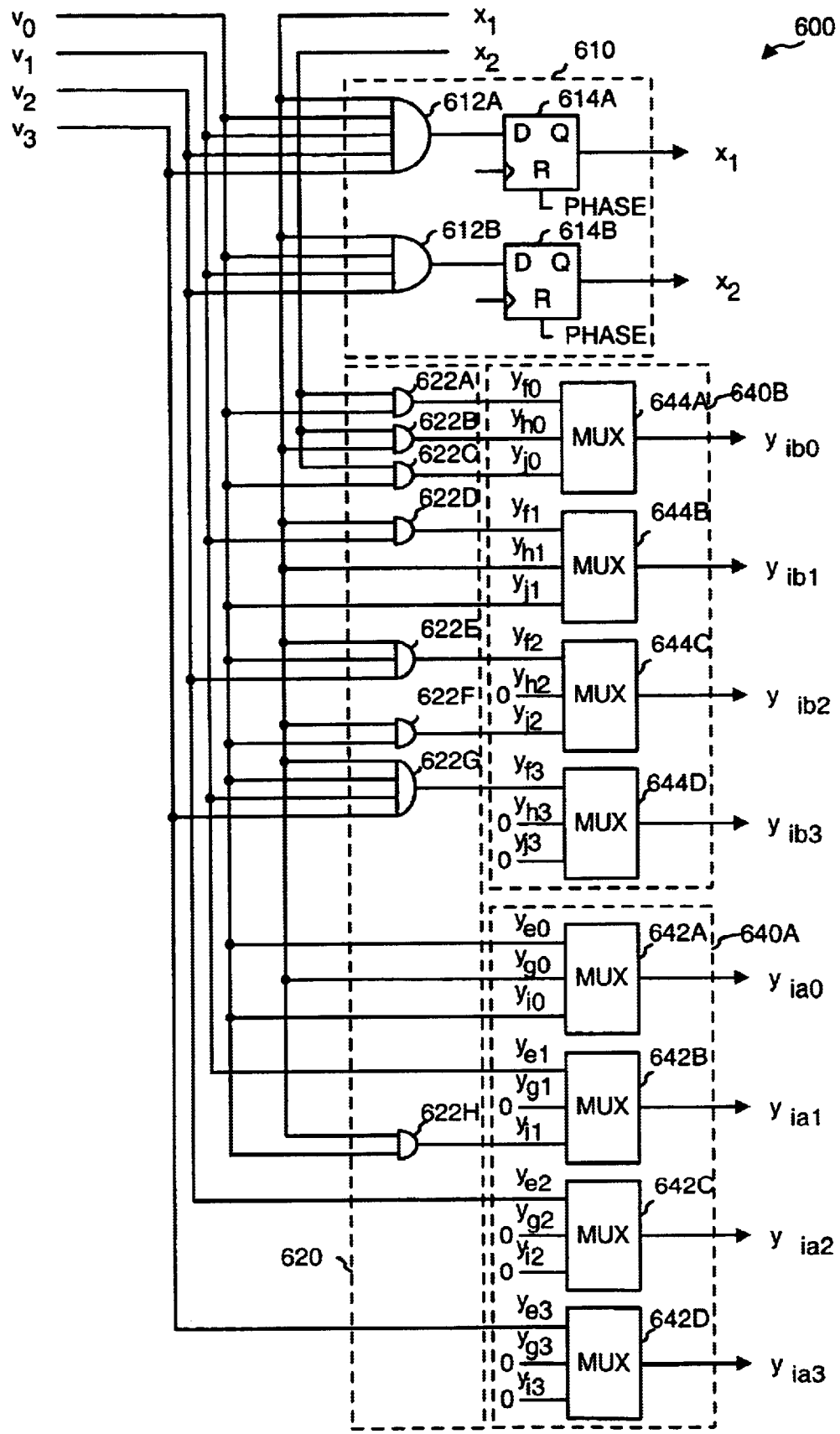
FIG. 6 is a schematic diagram of one embodiment of a convolutional encoder that implements another specific polynomial generator matrix and can code four code bits in parallel.

FIG. 6 is a schematic diagram of a specific embodiment of a convolutional encoder 600 that can code four input code bits in parallel and implements the polynomial generator matrix expressed in equation (2). Convolutional encoder 600 includes an encoder state machine 610 that implements the state machine defined by Table 4, an output generator 620 that generates the encoder outputs defined in Tables 4 through 6, and multiplexers 640A and 640B that provide the proper encoder outputs for the data and code-tail phases for packet formats 1 and 2.

As shown in FIG. 6, four input code bits, $v_0$ through $v_3$, are provided in parallel to the inputs of encoder state machine 610 and output generator 620, each of which also receives the current encoder state defined as $X_n=[x_2\ x_1]$. Each AND gate 612 within encoder state machine 610 selectively couples to the inputs $v_0$–$v_3$ and $x_1$–$x_2$, as defined by the last row in Table 4. For example, AND gate 612A couples to the inputs $x_1$, $v_0$, $v_1$, $v_2$, $v_3$, and $v_4$, as defined by the entry in the last row, third column ($x_1$) in Table 4. The outputs of AND gates 612A and 612B couple to the inputs of registers 614A and 614B, respectively. The outputs of registers 614A and 614B comprise the state machine outputs $x_1$ and $x_2$, respectively.

Similarly, each AND gate 622 within output generator 620 selectively couples to the inputs $v_0$–$v_3$ and $x_1$–$x_2$, as defined by the last two columns in Tables 4 through 6. For example, AND gate 622A couples to the inputs $x_2$ and $v_0$ and generates $y_{f0}$ (the second row, last column in Table 4), AND gate 622B couples to the inputs $x_2$ and $x_1$ and generates $y_{h0}$ (the second row, last column in Table 5), and AND gate 622C couples to the inputs $x_2$ and $v_0$ and generates $y_{j0}$ (the second row, last column in Table 6). The other encoder outputs are generated as indicated in Tables 4 through 6.

Multiplexer 640A includes 3×1 multiplexers 642A through 642D that provide the first encoder outputs $y_{ia0}$ through $y_{ia3}$, respectively, for inner convolutional encoder 600. During the data phases, $y_{e0}$ through $y_{e3}$ are provided through multiplexers 642A through 642D, respectively. During the code-tail phase, multiplexers 642A through 642D respectively provide $y_{g0}$ through $y_{g3}$ for packet format 1 and $y_{i0}$ through $y_{i3}$ for packet format 2. Similarly, multiplexer 640B includes 3×1 multiplexers 644A through 644D that provide the second encoder outputs $y_{ib0}$ through $y_{ib3}$, respectively, for inner convolutional encoder 600. During the data phases, $y_{f0}$ through $y_{f3}$ are provided through multiplexers 644A through 644D, respectively. During the code-tail phase, multiplexers 644A through 644D respectively provide $y_{h0}$ through $y_{h3}$ for packet format 1 and $y_{j0}$ through $y_{j3}$ for packet format 2.

Another aspect of the invention provides an interleaver capable of storing multiple code bits generated in parallel by the outer convolutional encoder and providing multiple code bits in parallel to the inner convolutional encoder. Referring back to FIG. 2, an interleaver is coupled between the outer and inner convolutional encoders. The interleaver is designed to store one or more packets of code bits. After an entire packet has been stored, the code bits are then retrieved in a read order that is different than the write order to achieve interleaving of the code bits. If no interleaving is desired, the code bits can be retrieved from the interleaver in the same order.

The outer convolutional encoder of the exemplary embodiment can be designed to receive and code M data bits in parallel and generate M·R code bits, where R is related to the code rate of the outer convolutional encoder (e.g., R=2 for a rate ½ encoder). To expedite processing and reduce delays, the interleaver can be designed to store M·R code bits from the outer convolutional encoder in parallel as the code bits are generated by the encoder. Similarly, the inner convolutional encoder can be designed to receive and code N code bits in parallel. Again, to expedite processing and reduce delays, the interleaver can be designed to provide at least N code bits in parallel to the inner convolutional encoder on a single read operation.

The code bits from each of the outer and inner convolutional encoders may be punctured to provide code bits at other code rates. For example, referring back to Table 1, the outputs from the outer convolutional encoder is unpunctured for packet format 1 to obtain a code rate of ½ and punctured for packet format 2 to obtain a code rate of ⅔. Similarly, the outputs from the inner convolutional encoder is unpunctured for packet format 1 to obtain a code rate of ½ and punctured for packet format 2 to obtain a code rate of ¾. The interface between the encoder and the interleaver can be designed to efficiently achieve the symbol puncturing.

Figure 7A:
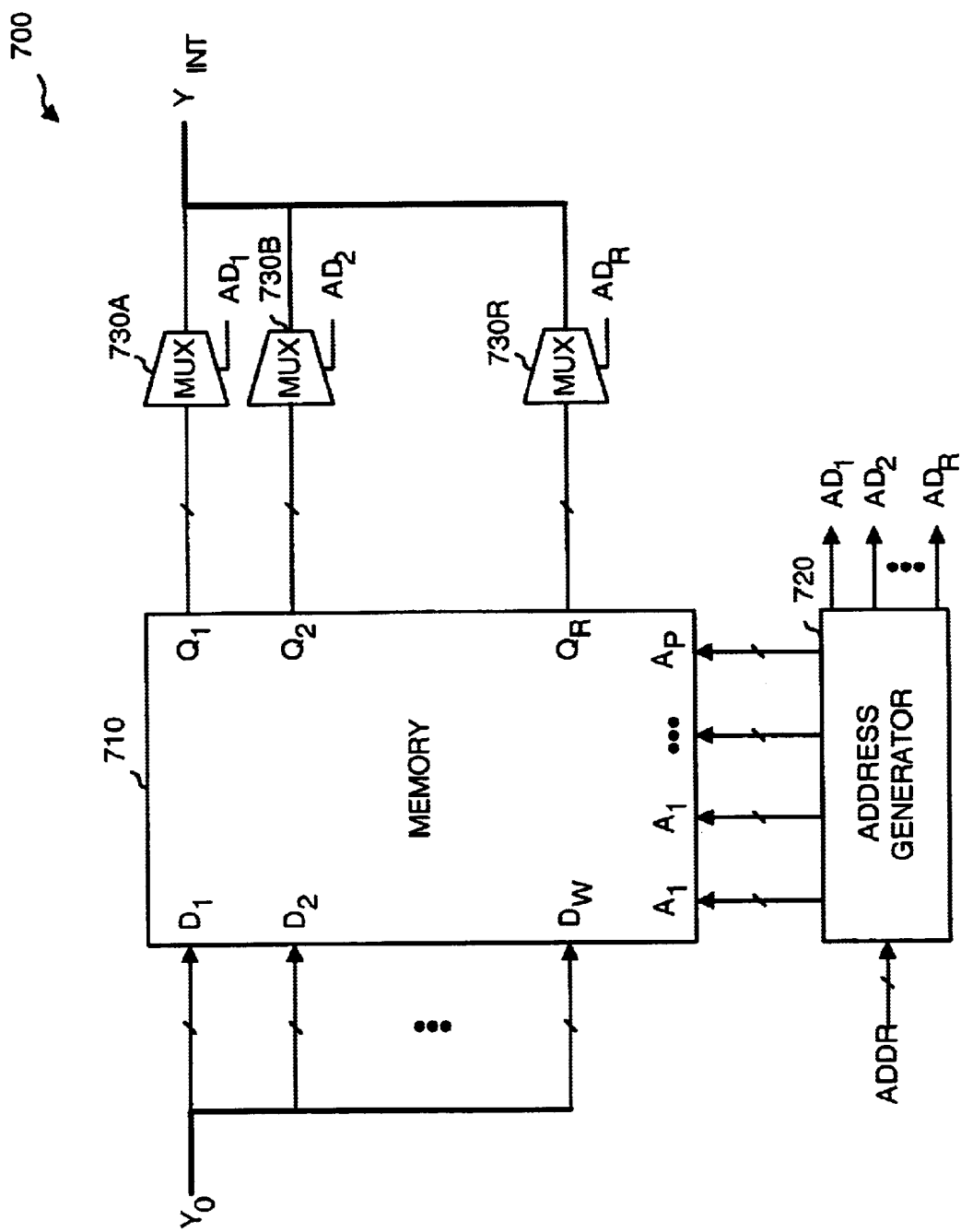
FIG. 7A is a diagram of an interleaver.

FIG. 7A is a diagram of an embodiment of an interleaver 700. In this embodiment, interleaver 700 is implemented with a multi-port memory 710 having P ports, where P is greater than one. Depending on the particular memory unit used to implement the interleaver, each of the P ports may be used as both write and read port or may be a dedicated write or read port. In the embodiment shown in FIG. 7A, memory 710 includes W ports designated as write ports $D_1$ through $D_W$, and R ports designated as read ports $Q_1$ through $Q_R$. Memory 710 further includes P address inputs, $A_1$ through $A_P$, one address input for each of the P ports. Each write and read port can transfer C bits in parallel.

An address generator 720 receives an input address ADDR, generates the necessary addresses for each active port, and provides the generated addresses to the address inputs $A_1$ through $A_P$ of memory 710. Although not shown in FIG. 7A for simplicity, address generator 720 further generates one or more control signals that direct memory 710 to perform a write or read operation.

In an embodiment, memory 710 is configured as a two-dimensional memory having a number of rows and a number of columns. In an embodiment, code bits are written to sequential rows in memory 710. For efficiency, the width of each row can correspond to the width of each port (i.e., C bits). This allows up to W rows of code bits to be written to the W write ports of memory 710 for each write operation. Once the code bits for an entire packet have been stored to memory 710 the code bits can be retrieved from the memory. In an embodiment, code bits are also read from memory 710 by rows. For the embodiment shown in FIG. 7A, up to R rows of code bits can be retrieved from the R read ports for each read operation.

Various designs can be used to provide code bits from interleaver 700 to the inner convolutional encoder. The particular design to implement is dependent on the particular system requirements. In one design, R multiplexers 730A through 730R are coupled to the R read ports $Q_1$ through $Q_R$, respectively. For each read operation, up to R rows of code bits are retrieved from memory 710 and provided to multiplexers 730A through 730R, which also receive the control signals $AD_1$ through $AD_R$, respectively. Each multiplexer 730 receives the C code bits, selects one of the code bits based on the respective control signal $AD_X$, and provides the selected code bit to the multiplexer output. The control signals $AD_1$ through $AD_R$ select a particular code bit from each retrieved row of code bits. R multiplexers 730 can thus be used to provide up to R code bits in parallel to the inner convolutional encoder.

For a clearer understanding, a specific design of the interleaver is now described for use with the outer and inner convolutional encoders described above in FIGS. 5A, 5B, and 6. In the above encoder designs, the outer convolutional encoder receives and codes 8 data bits in parallel in one clock cycle to generate 16 code bits, and the inner convolutional encoder receives and codes 4 code bits in parallel. In this specific interleaver design, an 8-port memory is employed, with four ports being used for receiving code bits in write operations and four ports being used for providing code bits in read operations. In this design, each port is capable of receiving or providing 8 bits in parallel. Thus, for this specific design, up to 32 code bits can be written to the interleaver in a write operation, and up to 32 code bits can be read from the interleaver in a read operation.

Figure 7B:
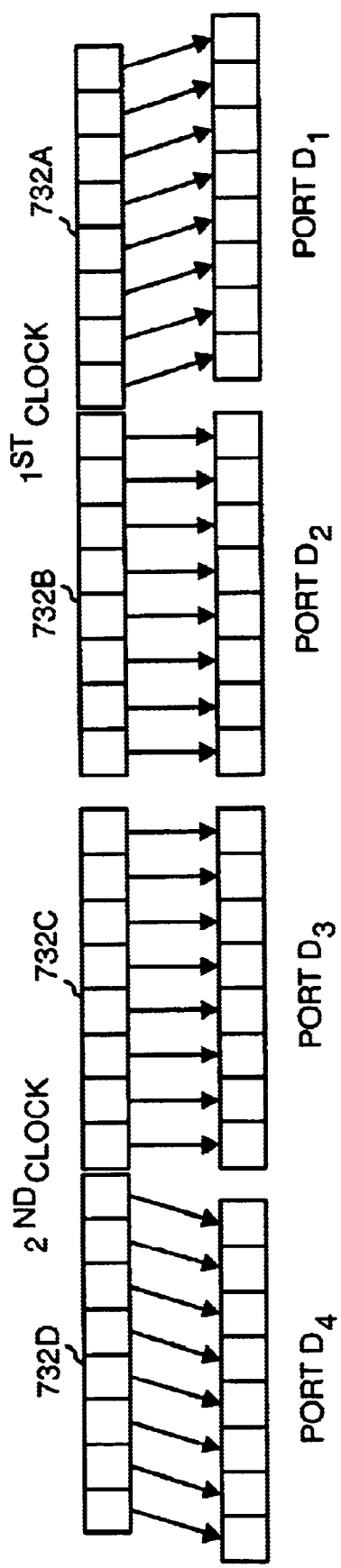
FIGS. 7B and 7C are diagrams of an interface between an outer convolutional encoder and an interleaver without and with puncturing, respectively, according to various embodiments.

FIG. 7B is a diagram of an embodiment of the interface between the outer convolutional encoder and the interleaver with no puncturing. In this embodiment, the code bits generated by the outer convolutional encoder are provided to four registers 732A through 732D. Registers 732A and 732B receive the 16 code bits generated in the first clock cycle and registers 732C and 732D receive the 16 code bits generated in the second (e.g., alternate) clock cycle. When no puncturing is performed, all 32-code bits on registers 732A through 732D are provided to ports $D_1$ through $D_4$, respectively, of the memory in one write operation.

Figure 7C:
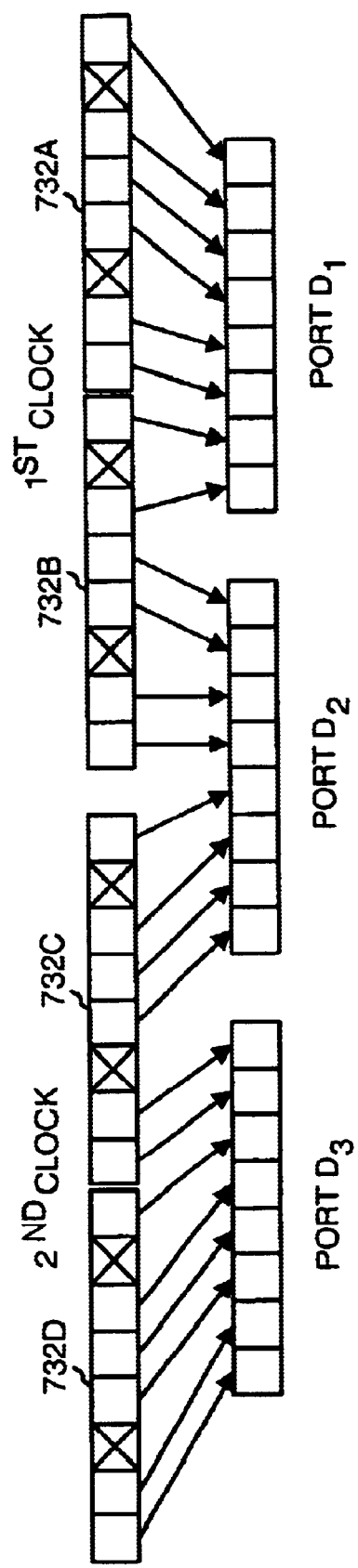

FIG. 7C is a diagram of an embodiment of the interface between the outer convolutional encoder and the interleaver with puncturing. Referring back to Table 1, the code bits for the outer code are punctured with the puncturing pattern (1011) for packet format 2. Thus, in one clock cycle, 16 code bits are generated, 4 code bits are punctured, and 12 code bits are stored. Initially, the 16 code bits generated in the first clock cycle are stored to registers 732A and 732B, and the 16 code bits generated in the second clock cycle are stored to registers 732C and 732D. After the puncturing, 24 code bits remain, as shown in FIG. 7C, and are provided to three write ports (e.g., $D_1$ through $D_3$).

The address generator provides the proper addresses for writing the unpunctured code bits to sequential rows in the memory. One address is generated for each active port used for writing the code bits. Thus, the address generator generates four addresses for port $D_1$ through $D_4$ when no puncturing is performed and generates three addresses for port $D_1$ through $D_3$ when puncturing is performed.

To provide four code bits in parallel to the inner convolutional encoder, four rows of code bits are retrieved from the memory and provided to four 8×1 multiplexers. Each multiplexer also receives a respective 3-bit control signal $AD_X$ that selects a particular bit in the retrieved row to provide to the inner convolutional encoder. The address for each retrieved bit may thus be partitioned into two parts, with the first part identifying a particular row in the memory and the second part identifying a particular location within the row. The first part of the address is provided to the appropriate address input of the memory and the second part is provided as the control signal $AD_X$. The first and second parts of the address are generated in accordance with the particular interleaving scheme defined by the system or standard being implemented.

The interleaver of the exemplary embodiment can also be implemented using other memories. For example, a single-port memory unit or multiple memory units can be used to concurrently store and provide multiple bits in parallel. For a single-port memory unit, multiple write operations may be used to store the generated code bits, and multiple read operations may also be used to retrieve the required code bits. In designs employing multiple memory units, each memory unit may be operated similar to a port (or a pair of ports) of the multi-port memory. Thus, numerous designs can be used to implement the interleaver and are within the scope of the present invention.

In the embodiments described above, an interleaver is used between the outer and inner convolutional encoders. This configuration is used to implement a Turbo encoder, which can provide certain advantages. In other encoder designs, interleaving after the outer convolutional encoder may not be necessary, and a memory may not be needed after the outer convolutional encoder or may simply be used as a buffer.

The concatenated encoder of the exemplary embodiment can be operated in various manners. In one specific design, the encoder is operated to code one packet of data at a time. Referring back to FIG. 2, a particular packet of data can be coded by the outer convolutional encoder and stored to the interleaver. After an entire packet has been coded by the outer convolutional encoder, the code bits are retrieved from the interleaver and coded by the inner convolutional encoder. Once the entire packet has been coded by the inner convolutional encoder, the next packet is coded by the outer convolutional encoder. This design reduces the memory requirement for the interleaver, which may be desirable in some applications.

In another specific design, the interleaver is implemented with the capacity to store two or more packets of code bits. For example, the memory used to implement the interleaver can be partitioned into two banks, with each memory bank being capable of storing an entire packet of code bits. The two memory banks allow the outer and inner convolutional encoders to operate on two packets concurrently. The outer convolutional encoder codes a first packet and stores the code bits for this packet to one memory bank. After the entire first packet has been stored to memory, the outer convolutional encoder codes a second packet and stores the code bits for this packet to the second memory bank. While the outer convolutional encoder codes and stores the code bits for the current packet to one memory bank, the inner convolutional encoder can retrieve and code the code bits for the previous packet from the other memory bank. This design can reduce the processing delays.

Figure 8:
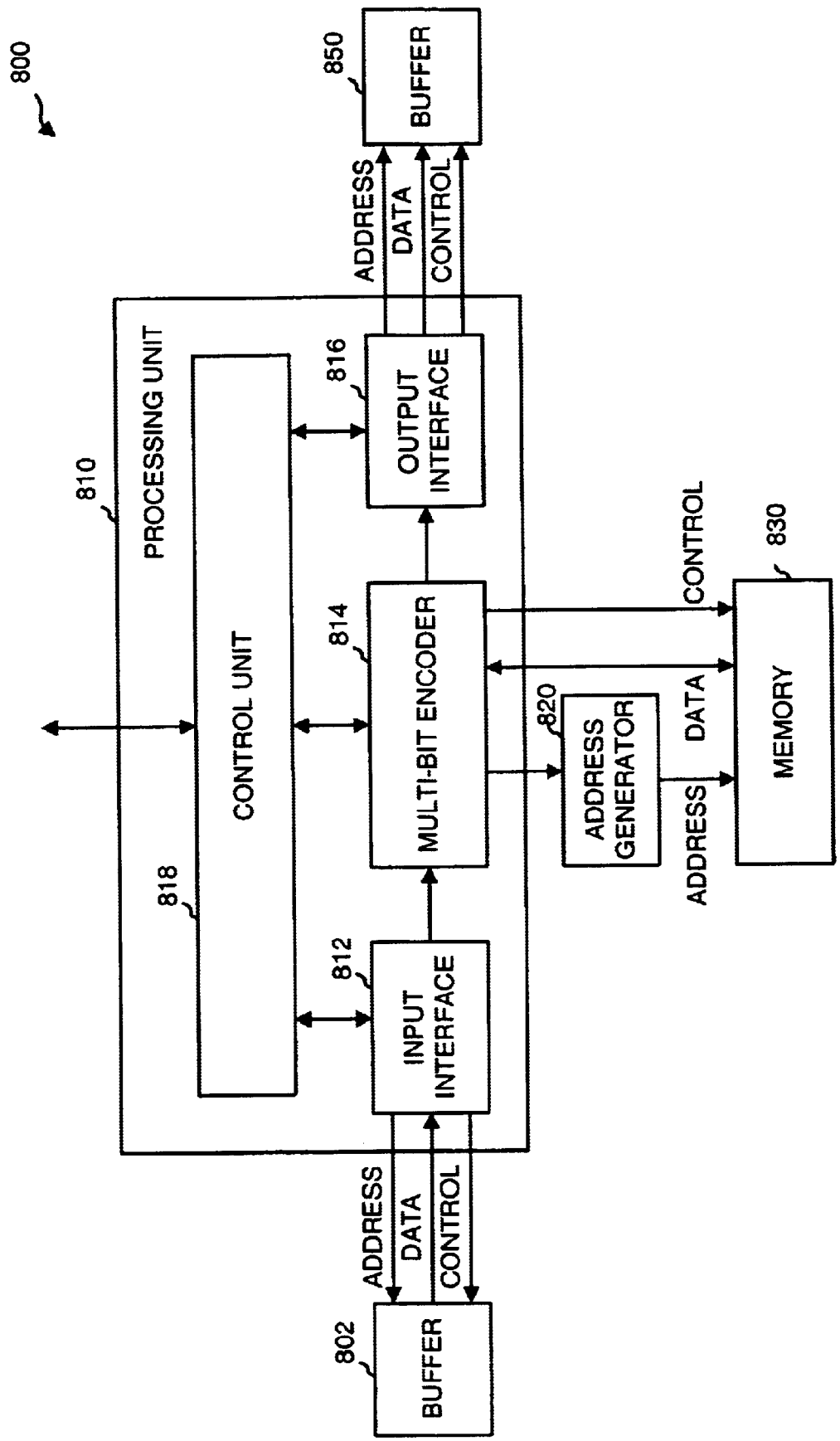
FIG. 8 is a block diagram of an encoder according to one embodiment.

FIG. 8 is a block diagram of a specific design of an encoder 800 that can be used to implement some embodiments. Encoder 800 may be used to implement encoder 114 in FIG. 1. Encoder 800 includes a processing unit 810 coupled to an address generator 820 and a memory 830. Processing unit 810 receives data from a buffer 802 and control information from a control source (not shown), codes the received data in accordance with the control information, and provides the coded data to a buffer 850.

In the embodiment shown in FIG. 8, processing unit 810 includes an input interface 812, a multi-bit encoder 814, an output interface 816, and a control unit 818. Input interface 812 generates addresses and control signals for buffer 802, receives data provided by buffer 802 in response to the generated addresses and control signals, and routes the received data to multi-bit encoder 814. Multi-bit encoder 814 implements the output and inner convolutional encoders and may be implemented with one or more look-up tables or one or more encoders such as the one described above in FIG. 4. When operated as an outer convolutional encoder, multi-bit encoder 814 codes the data from input interface 812 and provides the generated code bits to memory 830. And when operated as an inner convolutional encoder, multi-bit encoder 814 codes the code bits from memory 830 and provides the generated code bits to output interface 816. Output interface 816 then provides the coded data to buffer 850.

Control unit 818 receives various control information such as, for example, the particular data packet to code, the location of the packet in buffer 802, the packet format, the coding scheme to use, the location to store the coded packet in buffer 850, and so on. Control unit 818 then directs input interface 812 to retrieve the appropriate data bits from buffer 802, directs encoder state machine 814 to use the appropriate coding scheme, and further directs output interface 816 to provide the coded data to the appropriate location in buffer 850.

Address generator 820 generates the appropriate addresses for both writing code bits to memory 830 and reading code bits from the memory. Address generator 820 can be implemented with logic, a look-up table, or some other designs.

Memory 830 stores the code bits generated by multi-bit encoder 814 and also provides the stored code bits to multi-bit encoder 814. By properly generating the addresses, memory 830 can be operated to provide interleaving of the code bits. Memory 830 can be implemented with a multi-port memory, as described above, or with one or more memory units.

Figure 9:
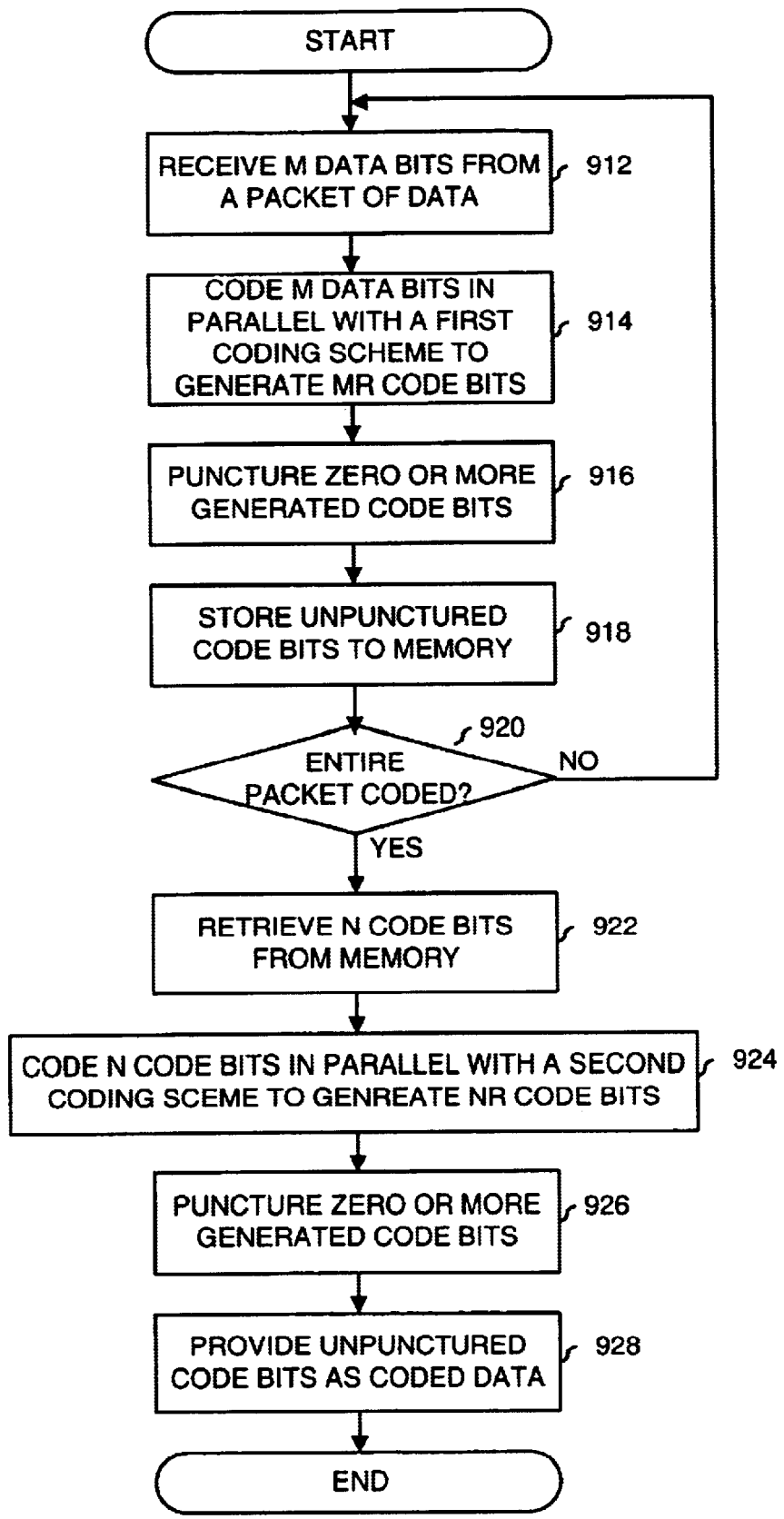
FIG. 9 is a flow diagram of a method for performing concatenated coding of multiple data bits in parallel according to one embodiment.

FIG. 9 is a flow diagram of an embodiment of a method for performing concatenated coding of multiple data bits in parallel. Initially, a number of (M) data bits from a particular data packet is received, at step 912, and coded in parallel in accordance with a first (e.g., convolutional) coding scheme to generate a number of (MR) code bits, at step 914. The number of code bits generated by the first coding scheme is dependent on the particular code rate of the scheme. Zero of more of the generated code bits may be punctured with a first puncturing scheme, at step 916, to provide code bits at a different code rate. The unpunctured code bits are then stored to a memory, at step 918.

In the embodiment shown in FIG. 9, an entire packet is coded by the first coding scheme and stored before subsequent coding by a second coding scheme. This allows for interleaving of the code bits, as described above. Thus, a determination is made whether the entire packet has been coded, at step 920. If the answer is no, the process returns to step 912 and another M (or less) data bits are received.

Otherwise, if the entire packet has been coded, a number of (N) code bits is retrieved from the memory, at step 922, and coded in parallel in accordance with the second (e.g., convolutional) coding scheme to generate a number of (NR) code bits, at step 924. Again, the number of code bits generated by the second coding scheme is dependent on the particular code rate of the scheme. And again, zero of more of the generated code bits may be punctured with a second puncturing scheme, at step 926, to provide code bits at another code rate. The unpunctured code bits are then provided as coded data to the next processing unit (e.g., modulator 116 in FIG. 1), at step 928.

For efficiency and reduced delays, W words may be stored in parallel (e.g., via W write ports) to the memory, and R words may be retrieved in parallel (e.g., via R read ports) from the memory. The W words allow for parallel storage of the unpunctured code bits from the first coding scheme and the R words allow for N code bits to be provided in parallel to the second coding scheme. The memory may be operated in the manner described above to achieve interleaving of the code bits. For example, W words may be written to sequential rows in the memory and R words may be read from permutated rows in the memory.

The encoder and interleaver of the exemplary embodiment can be used to greatly shorten the coding time. By coding M data bits in parallel with the outer convolutional encoder and N code bits in parallel with the inner convolutional encoder, the overall coding delays can be significantly reduced. The interleaver of the invention supports parallel coding with its ability to receive multiple code bits for a write operation and to provide multiple code bits for a read operation. The improvement in the processing delays for a specific design, with M=8 and N=4 and for packet formats 1 and 2 in the HDR system, is shown in Table 7.

TABLE 7

|  | Packet format 1 | | Packet format 2 | |
| --- | --- | --- | --- | --- |
|  | parallel | serial | parallel | serial |
| Outer convolutional encoder | | | | |
| Input bits | 1018 | | 2042 | |
| Code-tail bits | 4 | | 4 | |
| Total input bits | 1022 | | 2046 | |
| Clock cycles needed | 128 | 1024 | 256 | 2048 |
| Inner convolutional encoder | | | | |
| Input bits | 2044 | | 3069 | |
| Code-tail bits | 4 | | 3 | |
| Total input bits | 2048 | | 3072 | |
| Clock cycles needed | 512 | 2048 | 768 | 3072 |
| Coding time (20 MHz clock) | | | | |
| Outer encoder ($\mu$sec) | 6.4 | 51.2 | 12.8 | 102.4 |
| Inner encoder ($\mu$sec) | 25.6 | 102.4 | 38.4 | 153.6 |
| Total coding time ($\mu$sec) | 32.0 | 153.6 | 51.2 | 256.0 |

For the specific design shown in Table 7, the overall coding delays are reduced by a factor of 4.8 for packet format 1 and a factor of 5.0 for packet format 2. It can be observed that further improvement in the processing delays can be achieved by increasing the number of bits to code in parallel, especially for the inner convolutional encoder (i.e., increasing N).

The shorter processing delays provided by the encoder and interleaver of the present invention provide numerous advantages. Some of these advantages are briefly described below.

First, shorter processing delays may be used to support certain types of services, such as voice and video, which have more stringent delays requirements. The shorter processing delays may thus allow for use of more efficient coding schemes for delay sensitive applications.

Second, shorter processing delays can improve system performance. For example, if a particular user or data rate is selected for a particular transmission based on the conditions of the communications link, which are determined at a particular time, shorter processing delays increase the likelihood that the link conditions have not changed by the time of the data transmission. Link conditions typically vary over time, and longer processing delays increase the likelihood that the link conditions have changed by the time of the data transmission, which can then result in degraded performance.

Third, shorter processing delays can improve the capacity of some communications systems. For example, in the HDR system, power control data is multiplexed with the traffic data and transmitted to the user terminals. Shorter processing delays allow for more accurate control of the transmit power of the user terminals, which can increase the system capacity and improve performance.

Fourth, shorter processing delays allow sequential sharing of a hardware resource (i.e., the encoder) in one processing time slot (i.e., the forward link slot in an HDR system) by multiple transmitting entities (i.e., three users in a three sector system) to reduce the overall area of the hardware design.

For clarity, certain aspects and embodiments of the encoder of the invention have been described specifically for the forward link in the HDR system. However, the invention can also be used in other communications systems that employ the same, similar, or different coding schemes. For example, the encoder of the invention can be used to implement a convolutional encoder capable of receiving and coding multiple data bits in parallel. The encoder of the invention can also be used to implement a concatenated encoder, such as a Turbo encoder, that is capable of receiving and coding multiple data bits in parallel. The specific design of the encoder is dependent on various factors such as, for example, the particular polynomial generator matrix being implemented, the number of bits to code in parallel, the packet format, the use of code-tail bits, and so on.

The encoder of the invention can be advantageously used in a base station or a user terminal (e.g., a mobile unit, a telephone, and so on) of a communications system. The coding for the forward link (i.e., downlink) and reverse link (i.e., uplink) may be different, and is typically dependent on the particular CDMA system or standard being implemented. Thus, the encoder of the invention is typically designed specially for the particular application for which it is used.

Referring to the specific design shown in Tables 2 and 3, the next states and outputs for the outer convolutional encoder can be generated with functions having up to seven terms. Referring to the specific design shown in Tables 4 through 6, the next states and outputs for the inner convolutional encoder can be generated with functions having up to five terms. These functions can be easily generated using logic gates in a manner known in the art. The other elements of the outer and inner convolutional encoders (e.g., registers, multiplexers) can also be implemented in a manner known in the art.

Some or all of the elements described above for the encoder of the present invention (e.g., multi-bit encoder, input and output interfaces, control unit, encoder state machine, output generator, multiplexer, and so on) can be implemented within one or more application specific integrated circuits (ASICs), digital signal processors (DSPs), programmable logic device (PLD), Complex PLD (CPLD), controllers, micro-controllers, microprocessors, other electronic units designed to perform the functions described herein, or a combination thereof. Some or all of the elements of the encoder of the invention can also be implemented using software or firmware executed on a processor.

The memories and memory units such as the ones used to implement the interleaver of the present invention can be implemented with various memory technologies such as, for example, random access memory (RAM), dynamic RAM (DRAM), Flash memory, and others. The memory unit can also be implemented with storage elements such as, for example, a hard disk, a CD-ROM drive, and others. Various other implementation of the memory units are possible and within the scope of the present invention.

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A convolutional encoder for coding multiple data bits in parallel comprising:

state machine operative to receive a plurality of M data bits in parallel, the state machine having a plurality of parallel registers configured to provide a set of values indicative of a next state of the state machine, wherein the next state is a function of the M data bits and a set of values from the registers indicative of a current state of the state machine; and an output generator coupled to the state machine and operative to receive the M data bits and the set of values from the registers for the current state and generate a plurality of MR code bits in response thereto.

2. The convolutional encoder of claim 1, wherein the output generator includes:

a first output generator operative to receive the M data bits and the set of values for the current state and generate a first plurality of MR code bits in response thereto, and a second output generator operative to receive the M data bits and the set of values for the current state and generate a second plurality of MR code bits in response thereto, and wherein the first plurality of MR code bits is selected for a first coding phase and the second plurality of MR code bits is selected for a second coding phase, and wherein the state machine is set to a known state for the second coding phase.

3. The convolutional encoder of claim 2, wherein the known state is defined by a set of zero values.

4. The convolutional encoder of claim 1, wherein the state machine is configured to implement a particular polynomial generator matrix.

5. The convolutional encoder of claim 1, wherein the state machine comprises a set of logic elements, each logic element coupled to selected ones of the M data bits and selected ones of the set of values for the current state, the logic elements each having an output coupled to one of the registers.

6. The convolutional encoder of claim 1, wherein the state machine and output generator are designed to receive and code eight or more data bits in parallel.

7. A concatenated convolutional encoder comprising:

a first encoder configured to receive a plurality of parallel data bits, the first encoder having a plurality of parallel registers used to generate a first set of code bits as a function of the data bits; and a second encoder having a plurality of parallel registers used to generate a second set of code bits as a function of unpunctured code bits from the first set.

8. The concatenated convolutional encoder of claim 7, wherein each of the first and second encoders is configured to implement a polynomial generator matrix.

9. The concatenated convolutional encoder of claim 7, wherein the first encoder further comprises input logic configured to operate on the parallel data bits and apply the result to the registers of the first encoder, and wherein the second encoder further comprises input logic configured to operate on the unpunctured code bits from the first set and apply the result to the registers of the second encoder.

10. The concatenated convolutional encoder of claim 7, wherein the first encoder further comprises output logic arranged to generate the first set of code bits from the register outputs for the first encoder, and wherein the second encoder further comprises output logic arranged to generate the second set of code bits from the register outputs for the second encoder.

11. The concatenated convolutional encoder of claim 7, further comprising an interleaver coupled between the first and second encoders.

12. The concatenated convolutional encoder of claim 11, wherein the interleaver comprises memory configured to store the unpunctured code bits from the first set to sequential rows in the memory, and apply the unpunctured code bits to the second encoder from permutated rows in the memory.

13. The concatenated convolutional encoder of claim 12, wherein the interleaver further comprises a plurality of multiplexers coupled between the memory and the second encoder, the multiplexers being configured to select the permutated rows in the memory from which the unpunctured code bits are applied to the second encoder.

14. A data encoder comprising:

a convolutional encoder configured to receive a plurality of parallel inputs, the convolutional encoder having a plurality of parallel registers used to generate a set of code bits as a function of the inputs;

an input interface configured to provide a plurality of data bits to the parallel inputs of the convolutional encoder during an outer convolutional encoding operation;

a memory configured to store a first set of unpunctured code bits from the convolutional encoder during the outer convolutional encoding operation, and provide the first set of the unpunctured code bits to the parallel inputs of the convolutional encoder during an inner convolutional encoding operation; and an output interface configured to receive a second set of unpunctured code bits from the convolutional encoder during an inner convolutional encoding operation, and output the second set of the unpunctured code bits as coded data.

15. The data encoder of claim 14, further comprising:

an address generator configured to generate addresses for write and read operations for the memory.

16. A method of concatenated convolutional encoding comprising:

receiving a plurality of parallel data bits;

generating a first set of code bits as a function of the data bits using a plurality of parallel registers; and generating a second set of code bits from unpunctured code bits from the first set using a plurality of parallel registers.

17. The method of claim 16, wherein the generation the first and second set of code bits further comprises time sharing the same parallel registers.

18. The method of claim 16, wherein the parallel registers used to generate the first set of code bits is different from the parallel registers used to generate the second set of code bits.

19. The method of claim 16, wherein the generation of the first and second set of code bits each comprises implementing a polynomial generator matrix.

20. The method of claim 16, wherein the generation of the first set of code bits further comprises operating on the data bits with input logic and applying the results to the registers used to generate such first set of code bits, and wherein the generation of the second set of code bits further comprises operating on the unpunctured code bits from the first set with input logic and applying the result to the registers used to generate such second set of code bits.

21. The method of 16, wherein the generation of the first set of code bits further comprises operating on the register outputs used to generate such first set of code bits with output logic, and wherein the generation of the second set of code bits further comprises operating on the register outputs used to generate such second set of code bits with output logic.

22. The method of claim 16, further comprising interleaving the unpunctured code bits from the first set, the second set of code bits being generated from the interleaved unpunctured code bits.

23. The method of claim 22, wherein the interleaving of the unpunctured code bits from the first set comprises storing the unpunctured code bits from the first set to sequential rows in memory, and reading the unpunctured code bits stored in the memory from permutated rows.

24. The method of claim 23, wherein the reading of the unpunctured code bits stored in the memory from permutated rows comprises selectively multiplexing between the rows in the memory.

* * * * *